(12) United States Patent
Schneider et al.

(10) Patent No.: US 12,143,078 B2
(45) Date of Patent: Nov. 12, 2024

(54) CIRCUIT ELEMENT PAIR MATCHING METHOD AND CIRCUIT

(71) Applicant: Cirrus Logic International Semiconductor Ltd., Edinburgh (GB)

(72) Inventors: Edmund M. Schneider, Austin, TX (US); Ramin Zanbaghi, Austin, TX (US); Terence C. Bowness, Austin, TX (US); Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 673 days.

(21) Appl. No.: 17/331,525

(22) Filed: May 26, 2021

(65) Prior Publication Data

US 2022/0190794 A1 Jun. 16, 2022

Related U.S. Application Data

(63) Continuation-in-part of application No. 17/119,228, filed on Dec. 11, 2020, now Pat. No. 11,791,779.
(Continued)

(51) Int. Cl.
| | |
|---|---|
| *H03F 3/21* | (2006.01) |
| *H03F 1/30* | (2006.01) |
| *H03F 3/217* | (2006.01) |
| *H03F 3/45* | (2006.01) |
| *H03H 11/04* | (2006.01) |

(52) U.S. Cl.
CPC ........... *H03F 3/2175* (2013.01); *H03F 1/303* (2013.01); *H03F 3/45475* (2013.01); *H03H 11/0422* (2013.01); *H03F 2200/271* (2013.01)

(58) Field of Classification Search
CPC .... H03F 3/2175; H03F 3/45475; H03F 1/303; H03H 11/0422
See application file for complete search history.

(56) References Cited

U.S. PATENT DOCUMENTS

| | | |
|---|---|---|
| 4,599,719 A | 7/1986 | Breen et al. |
| 7,358,809 B2 | 4/2008 | Elder |

(Continued)

OTHER PUBLICATIONS

Ray, Sourja et al. "A 13-b Linear, 40-MS/s Pipelined ADC with Self-Configured Capacitor Matching." IEEE Journal of Solid-State Circuits, vol. 42, No. 3, Mar. 2007. pp. 463-474.

*Primary Examiner* — Patricia T Nguyen
(74) *Attorney, Agent, or Firm* — E. Alan Davis; Huffman Law Group, PC

(57) ABSTRACT

A method for matching a pair of composite circuit elements (CEs) included in a circuit includes fabricating N CEs (e.g., resistors, transistors, current sources, capacitors) designed to match and switches configurable, according to M different combinations, to connect N/2 of the N CEs to form a first composite CE and to connect a remaining N/2 of the N CEs to form a second composite CE. Sequentially in time, for each combination of the M combinations, the switches are configured to form the first and second composite CEs according to the combination and a characteristic of the circuit is measured that includes the formed first and second composite CEs. The characteristic indicates how well the formed composite CEs match. A final combination of the M combinations is chosen whose measured characteristic indicates a best match and the final combination is used to configure the switches to form the composite CEs.

50 Claims, 23 Drawing Sheets

Related U.S. Application Data

(60) Provisional application No. 63/188,242, filed on May 13, 2021.

(56) References Cited

U.S. PATENT DOCUMENTS

| | | | |
|---|---|---|---|
| 9,735,736 B2* | 8/2017 | Kusuda | H03F 3/45475 |
| 9,859,907 B1* | 1/2018 | Li | H03M 1/0678 |
| 9,876,518 B2 | 1/2018 | Kim et al. | |
| 10,158,444 B1 | 12/2018 | Darras | |
| 10,382,687 B1 | 8/2019 | Patel et al. | |
| 10,396,724 B1 | 8/2019 | Daigle et al. | |
| 11,228,291 B2* | 1/2022 | Kusuda | H03F 1/26 |
| 11,621,683 B2 | 4/2023 | Xu et al. | |
| 2006/0016966 A1 | 1/2006 | Hughes et al. | |
| 2006/0125563 A1* | 6/2006 | Elder | H03F 1/301 |
| | | | 330/253 |
| 2007/0050582 A1 | 3/2007 | Mangione-Smith | |
| 2008/0240301 A1 | 10/2008 | Mandal et al. | |
| 2010/0019842 A1* | 1/2010 | Larson | H03F 3/45928 |
| | | | 330/278 |
| 2010/0290769 A1 | 11/2010 | Nasiri et al. | |
| 2011/0063146 A1 | 3/2011 | Matthews et al. | |
| 2011/0228667 A1 | 9/2011 | Wang | |
| 2012/0063756 A1 | 3/2012 | Kang et al. | |
| 2012/0096290 A1 | 4/2012 | Shkolnikov et al. | |
| 2013/0124763 A1 | 5/2013 | Kessler | |
| 2014/0077873 A1* | 3/2014 | Motz | H03F 3/45977 |
| | | | 330/9 |
| 2014/0079098 A1 | 3/2014 | Harjani et al. | |
| 2014/0225591 A1 | 8/2014 | Knierim et al. | |
| 2014/0229754 A1 | 8/2014 | Overby et al. | |
| 2015/0134862 A1 | 5/2015 | Sthoeger et al. | |
| 2015/0319365 A1 | 11/2015 | Lloyd et al. | |
| 2016/0269828 A1 | 9/2016 | Smith et al. | |
| 2018/0076780 A1* | 3/2018 | Wang | H03F 3/45071 |
| 2018/0270424 A1 | 9/2018 | Li et al. | |
| 2019/0320377 A1 | 10/2019 | Maruta et al. | |
| 2020/0019378 A1 | 1/2020 | Watanabe et al. | |
| 2020/0065212 A1 | 2/2020 | Chanda et al. | |
| 2020/0120283 A1 | 4/2020 | Min | |
| 2020/0307832 A1 | 10/2020 | Wichowski et al. | |
| 2020/0393529 A1 | 12/2020 | Larson et al. | |
| 2021/0029319 A1 | 1/2021 | McFarland et al. | |
| 2021/0096389 A1 | 4/2021 | Kim | |
| 2021/0143835 A1 | 5/2021 | Gonzalez et al. | |
| 2021/0258136 A1 | 8/2021 | Hoffleit et al. | |
| 2021/0305955 A1* | 9/2021 | Ozalevli | H03F 3/387 |
| 2021/0321039 A1 | 10/2021 | Kim et al. | |
| 2021/0356843 A1 | 11/2021 | Deo et al. | |
| 2022/0124568 A1 | 4/2022 | Wu et al. | |
| 2022/0190789 A1 | 6/2022 | Zanbaghi et al. | |
| 2022/0321765 A1 | 10/2022 | Djadi et al. | |
| 2022/0329725 A1 | 10/2022 | Djadi et al. | |
| 2022/0413474 A1 | 12/2022 | Nishiyama et al. | |
| 2023/0117027 A1 | 4/2023 | Fang et al. | |
| 2023/0209189 A1 | 6/2023 | Feng | |
| 2024/0179655 A1 | 5/2024 | Harada et al. | |

* cited by examiner

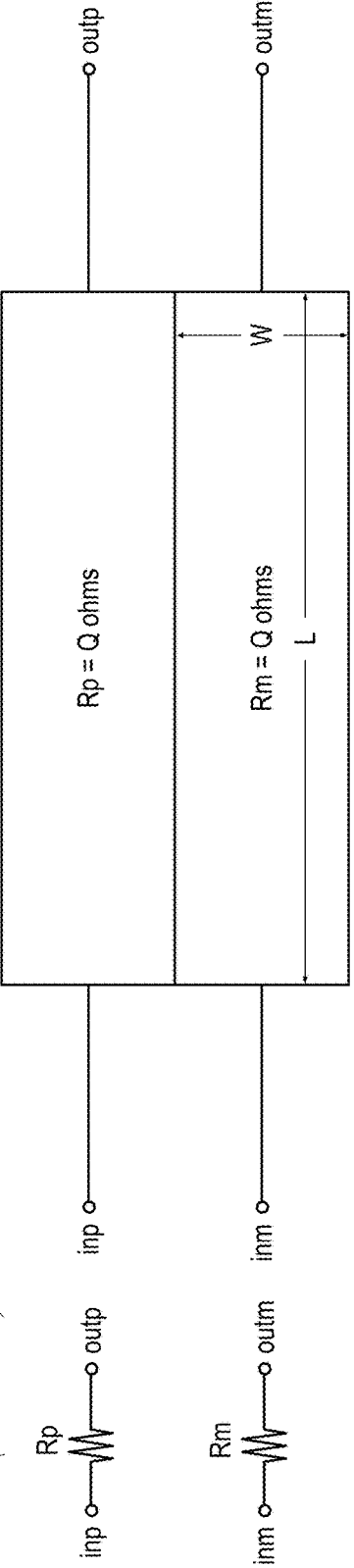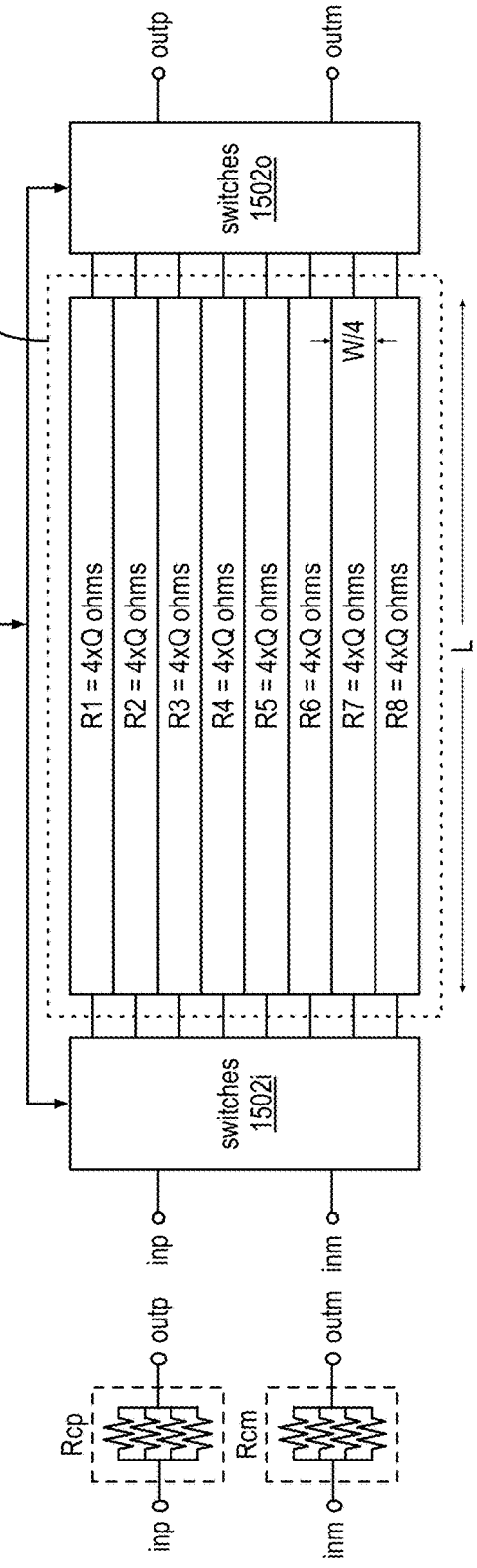

SPECTRALLY SEPARATE ERROR INDUCED BY MISMATCH OF RESISTANCES OF THE FIRST AND SECOND COMPOSITE RESISTORS FROM MISMATCH-INDUCED ERROR OF OTHER PAIRS OF ELEMENTS OF THE CIRCUIT, E.G., CHOP THE FIRST AND SECOND COMPOSITE RESISTORS AND DO NOT CHOP THE OTHER ELEMENT PAIRS OF THE CIRCUIT, OR DO NOT CHOP THE FIRST AND SECOND COMPOSITE RESISTORS AND CHOP THE OTHER ELEMENT PAIRS OF THE CIRCUIT, OR CHOP THE FIRST AND SECOND COMPOSITE RESISTORS AT A DIFFERENT CHOPPING FREQUENCY THAN THE OTHER ELEMENT PAIRS OF THE CIRCUIT; SWITCHES MAY BE USED TO CHOP THE FIRST AND SECOND COMPOSITE RESISTORS BY ALTERNATING BETWEEN COMBINATION J AND THE INVERSE OF COMBINATION J  1802

MEASURE ERROR INDUCED BY MISMATCH OF THE FIRST AND SECOND COMPOSITE RESISTORS AT OUTPUT OF CIRCUIT, E.G., USE ADC TO MONITOR OUTPUT OF CIRCUIT AND ANALYZE ADC OUTPUT TO DETERMINE PORTION OF INPUT OFFSET OF CIRCUIT (E.G., AMPLIFIER) INDUCED BY MISMATCH OF FIRST AND SECOND COMPOSITE RESISTORS  1804

EACH OF THE N RESISTORS IS DESIGNED TO HAVE RESISTANCE EQUAL TO (N/2) * R, WHERE R IS THE TARGET RESISTANCE OF EACH OF THE FIRST AND SECOND COMPOSITE RESISTORS, AND THE SWITCHES CAN BE CONFIGURED TO CONNECT EACH OF THE N/2 SETS OF THE N RESISTORS IN PARALLEL TO FORM THE COMPOSITE RESISTORS  1902

FIG. 21

FROM BLOCK 1718

DURING MISSION MODE:
- USE THE SWITCHES TO CHOP THE FIRST AND SECOND COMPOSITE RESISTORS FORMED BY THE FINAL COMBINATION (E.G., ALTERNATING BETWEEN THE FINAL COMBINATION AND THE INVERSE OF THE FINAL COMBINATION), AND
- DE-CHOP THE OUTPUT OF THE CIRCUIT 2102

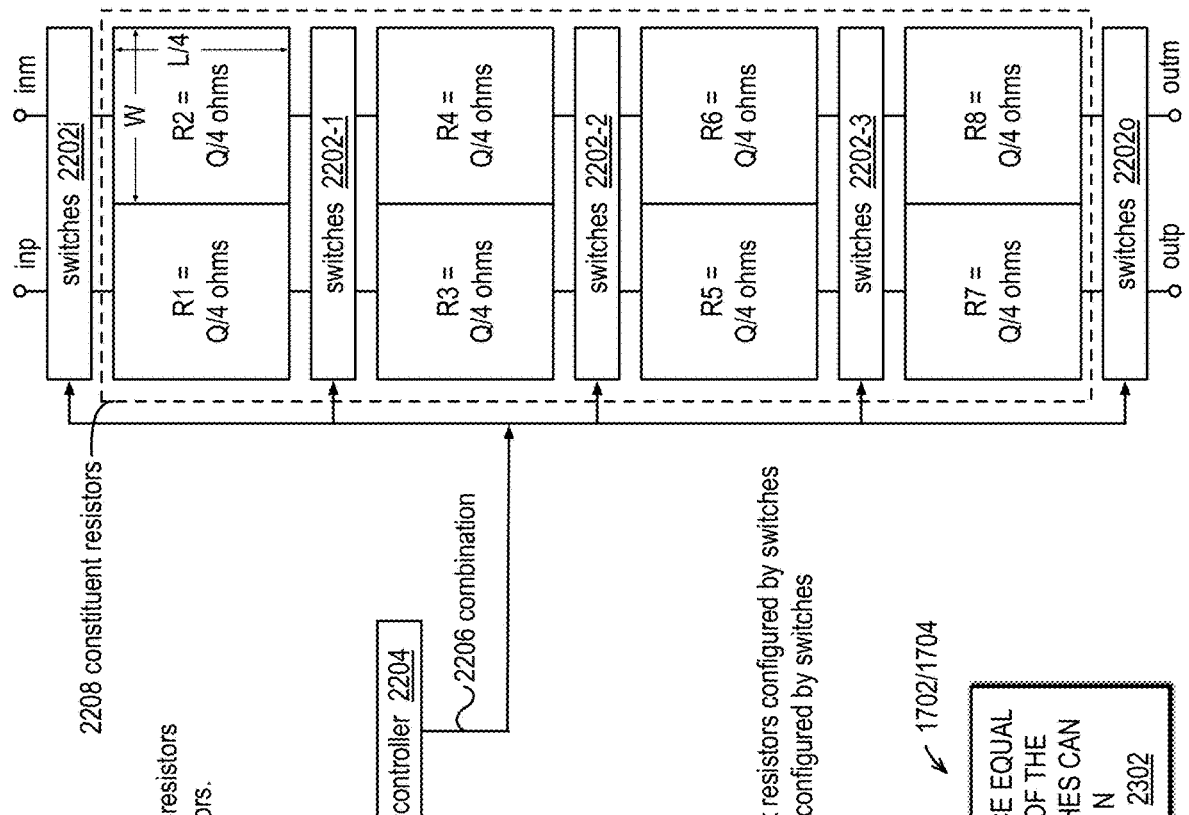

FIG. 22

N = number of constituent resistors from which to form pair of composite resistors by configuring switches to connect different sets of N/2 constituent resistors.
N = 8 constituent resistors R1-R8 in the example of Figure 22.

composite resistor Rcp = series combination of N/2 of R1-Rn constituent resistors configured by switches
composite resistor Rcm = series combination of remaining N/2 of R1-Rn configured by switches

FIG. 23

EACH OF THE N RESISTORS IS DESIGNED TO HAVE RESISTANCE EQUAL TO R / (N / 2), WHERE R IS THE TARGET RESISTANCE OF EACH OF THE FIRST AND SECOND COMPOSITE RESISTORS, AND THE SWITCHES CAN BE CONFIGURED TO CONNECT EACH OF THE N/2 SETS OF THE N RESISTORS IN SERIES TO FORM THE COMPOSITE RESISTORS  2302

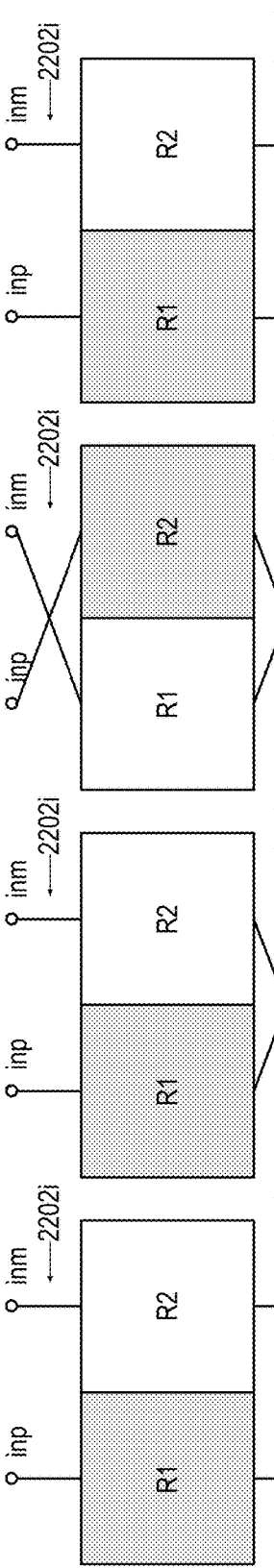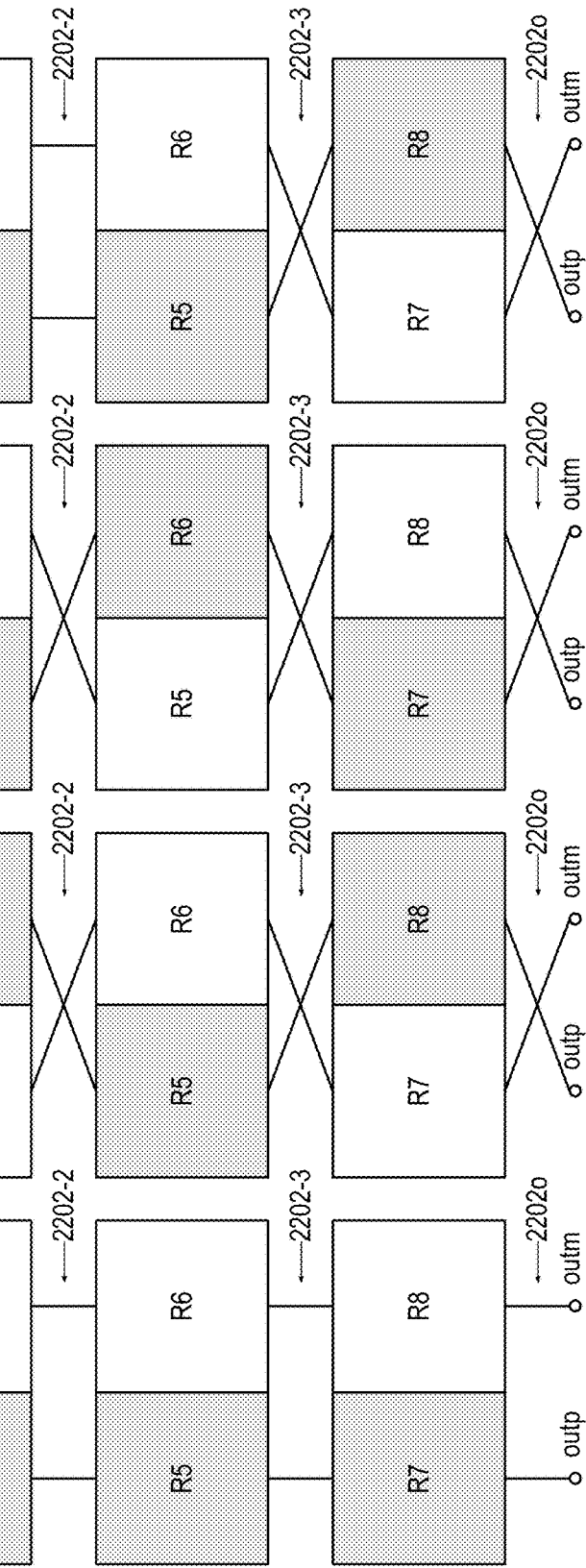

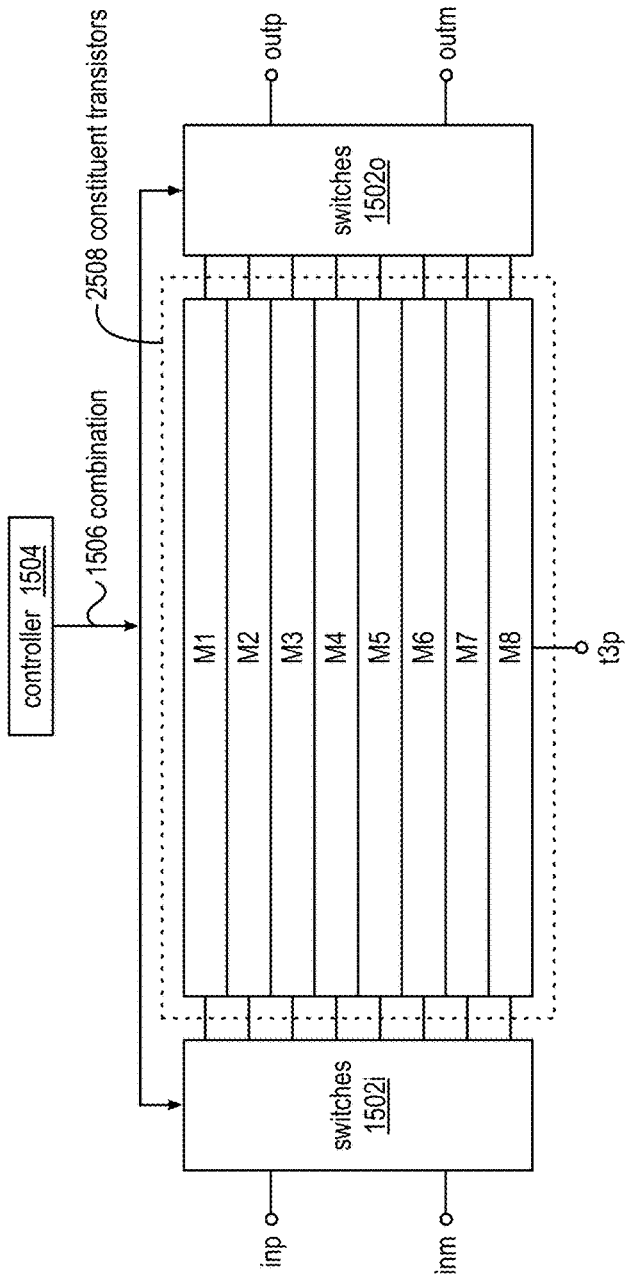

FIG. 25

N = number of constituent transistors from which to form pair of composite transistors by configuring switches to connect different sets of N/2 constituent transistors. N = 8 constituent transistors M1-M8 in the example of Figure 25.

composite transistor Mcp = parallel combination of N/2 of M1-Mn constituent transistors configured by switches
composite transistor Mcm = parallel combination of remaining N/2 of M1-Mn configured by switches

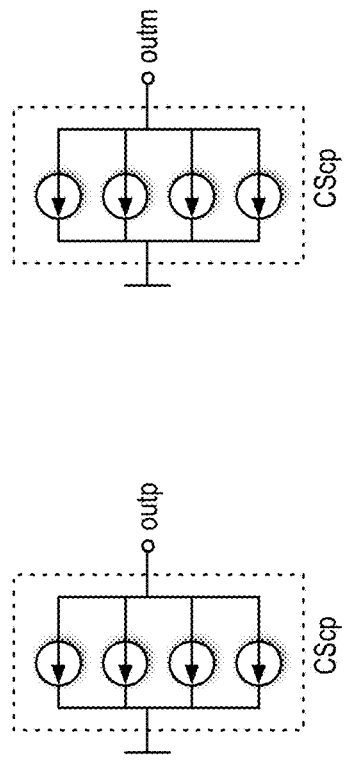
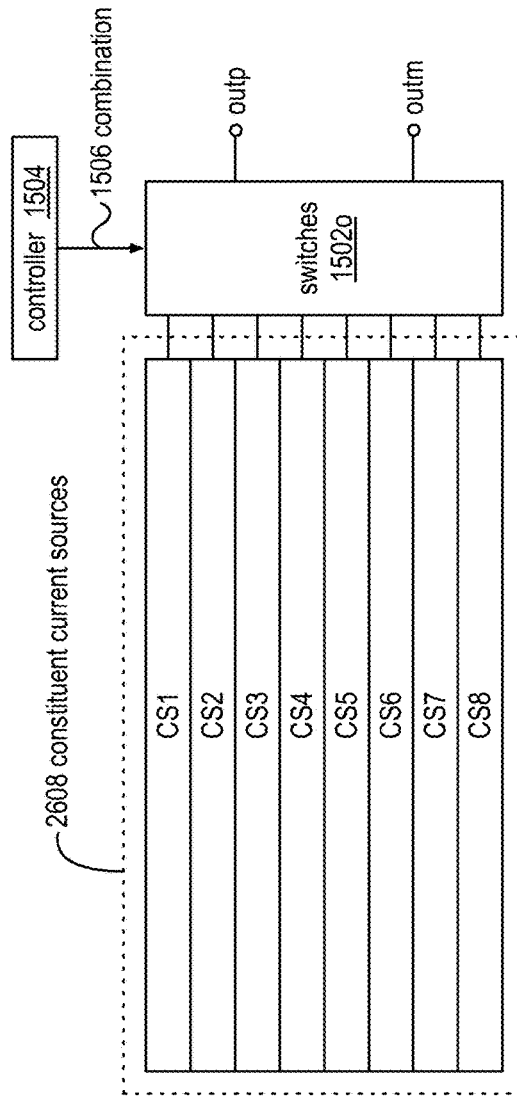

N = number of constituent current sources from which to form pair of composite current sources by configuring switches to connect different sets of N/2 constituent current sources. N = 8 constituent current sources CS1-CS8 in the example of Figure 26.

composite current source CScp = parallel combination of N/2 of CS1-CSn constituent current sources configured by switches
composite current source CScm = parallel combination of remaining N/2 of CS1-CSn configured by switches

FIG. 26

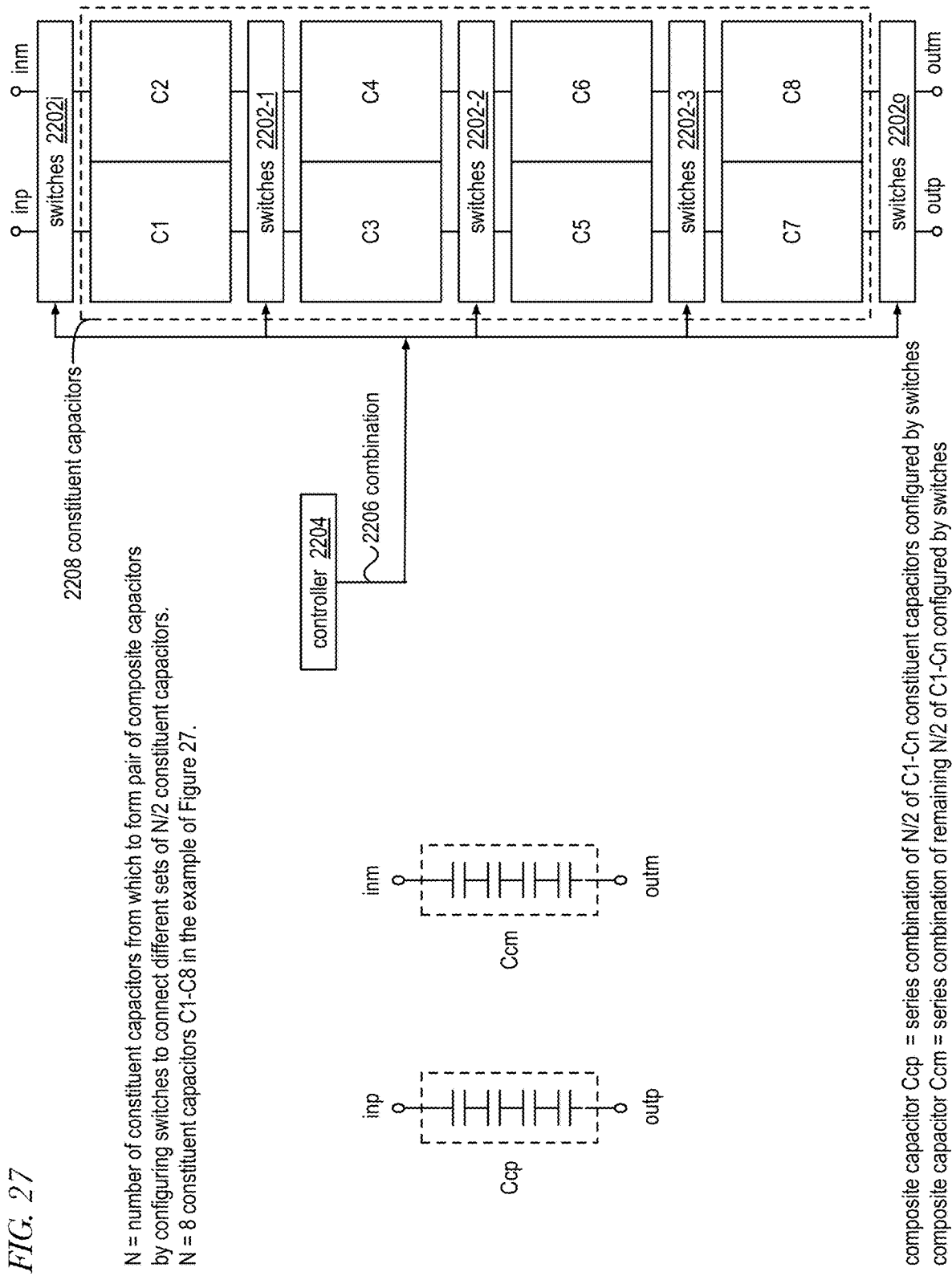

CIRCUIT ELEMENT PAIR MATCHING METHOD AND CIRCUIT

CROSS REFERENCE TO RELATED APPLICATION(S)

This application is a continuation-in-part (CIP) of U.S. Non-Provisional application Ser. No. 17/119,228, filed Dec. 11, 2020, which is hereby incorporated by reference in its entirety.

BACKGROUND

Analog circuits are commonly designed with pairs of differential circuit elements, e.g., resistors, capacitors, current sources. Often, the design relies on the elements of the differential pair to be a matched pair. If the elements of the pair do not match, then the analog circuit may not operate as desired, or may operate in a sub-optimal fashion. For example, if the resistance values do not match to a differential pair of input resistors of an analog gain stage, then an input offset of the gain stage may be introduced. The input offset may affect the performance of the analog gain stage and may affect the operation and performance of the system that includes the analog gain stage. For example, the performance of an audio amplifier may be affected by the offset input.

One conventional approach to reducing differential element pair mismatch is to "oversize" the elements. That is, the elements are designed to be larger than actually needed to perform the intended function. Oversizing tends to reduce the overall percentage by which the elements in the pair mismatch since the amount of mismatch is a smaller percentage of a larger element than a smaller element, and the reduced percentage of mismatch may reduce the effect of the mismatch on the performance of the analog circuit. However, the benefit of oversizing the pair elements may have the associated drawbacks of taking up more area of the integrated circuit, consuming more power and reducing the bandwidth of the circuit by increasing parasitic capacitance.

Another conventional approach to reducing differential element pair mismatch is to chop the pair of elements at a chopping frequency to move a mismatch-induced input offset (for example, that normally appears in the output frequency spectrum around DC (direct current), i.e., around zero frequency) to around the chopping frequency, and then filter out (e.g., via a low pass filter or a notch filter) the offset energy that was chopped up to the chopping frequency. However, a side effect of chopping is that energy in the input signal around the chopping frequency may be folded back to around DC within the output frequency spectrum. That is, input signal energy outside the frequency band of interest may undesirably get folded back into the output within the frequency band of interest.

Thus, conventional chopping to reduce mismatch may not be an acceptable solution in some applications, particularly if the input signal energy spectrum makes it difficult to find an acceptable chopping frequency that does not introduce the fold-back problem.

SUMMARY

In one embodiment, the present disclosure provides a method for matching a pair of composite circuit elements included in a circuit. The method includes fabricating N circuit elements designed to match and fabricating switches configurable after fabrication, according to M different combinations, to connect N/2 of the N circuit elements to form a first composite circuit element of the pair and to connect a remaining N/2 of the N circuit elements to form a second composite circuit element of the pair. The method also includes, sequentially in time, for each combination of the M combinations, configuring the switches to form the first and second composite circuit elements according to the combination and measuring a characteristic of the circuit that includes the formed first and second composite circuit elements. The characteristic is indicative of how well the formed first and second composite circuit elements match. The method also includes choosing a final combination of the M combinations whose measured characteristic indicates a best match and configuring the switches to form the first and second composite circuit elements according to the final combination.

In another embodiment, the present disclosure provides a circuit in which a pair of composite circuit elements may be configured to match includes N circuit elements designed to match and switches configurable after fabrication, according to M different combinations, to connect N/2 of the N circuit elements to form a first composite circuit element of the pair and to connect a remaining N/2 of the N circuit elements to form a second composite circuit element of the pair. The circuit also includes control logic configured to, sequentially in time, for each combination of the M combinations, configure the switches to form the first and second composite circuit elements according to the combination and measure a characteristic of the circuit that includes the formed first and second composite circuit elements. The characteristic is indicative of how well the formed first and second composite circuit elements match. The control logic is further configured to choose a final combination of the M combinations whose measured characteristic indicates a best match and configure the switches to form the first and second composite circuit elements according to the final combination.

The circuit elements may be resistors, transistors, current sources, or capacitors. Measuring the characteristic of the circuit may include spectrally separating error induced by mismatch of the first and second composite circuit elements formed by the combination from mismatch-induced error of other pairs of elements of the circuit and measuring the error induced by mismatch of the first and second composite circuit elements at an output of the circuit. Spectrally separating error induced by mismatch of the first and second composite circuit elements formed by the combination from mismatch-induced error of other pairs of elements of the circuit may include using the switches to chop the first and second composite circuit elements and not chopping the other pairs of elements of the circuit, which may include alternating between configuring the switches according to the combination and configuring the switches according to an inverse of the combination. Spectrally separating error induced by mismatch of the first and second composite circuit elements formed by the combination from mismatch-induced error of other pairs of elements of the circuit may include using the switches to chop the first and second composite circuit elements at a first chopping frequency while the other pairs of elements of the circuit are chopped at different chopping frequencies than the first chopping frequency. Measuring the error induced by mismatch of the first and second composite circuit elements at an output of the circuit may include monitoring, by an analog-to-digital converter (ADC), an output of the circuit, and analyzing the monitored output to measure the error induced by mismatch of the first and second composite circuit elements. The error induced by mismatch of the first and second composite circuit elements formed by the combination comprises a portion of an input offset of the circuit induced by the mismatch. The switches may be configurable to connect the N/2 of the N circuit elements in parallel to form the first composite circuit element and to connect the remaining N/2 of the N circuit elements in parallel to form the second composite circuit element. Alternatively, the switches may be configurable to connect the N/2 of the N circuit elements in series to form the first composite circuit element and to connect the remaining N/2 of the N circuit elements in series to form the second composite circuit element. Choosing the final combination of the M combinations whose measured characteristic indicates the best match may be performed during a calibration phase that occurs after reset of the circuit and prior to operating the circuit in a mission mode. During the mission mode, the switches may be used to chop the first and second composite circuit elements formed by the final combination, and the output of the circuit may be de-chopped.

BRIEF DESCRIPTION OF THE DRAWINGS

FIG. 14 is diagram illustrating a pair of prior art resistors.

FIG. 15 is an example circuit diagram illustrating a pair of composite resistors in accordance with embodiments of the present disclosure.

FIG. 18 is an example flowchart illustrating a method of performing a block of FIG. 17 in accordance with embodiments of the present disclosure.

FIG. 19 is an example flowchart illustrating a method of performing blocks of FIG. 17 in accordance with embodiments of the present disclosure.

FIG. 21 is an example flowchart illustrating a method of chopping dynamically configurable composite resistors operating in mission mode in accordance with embodiments of the present disclosure.

FIG. 22 is an example circuit diagram illustrating a pair of composite resistors in accordance with an alternate embodiment of the present disclosure.

FIG. 23 is an example flowchart illustrating a method of performing blocks of FIG. 17 in accordance with embodiments of the present disclosure.

FIGS. 24A through 24D are diagrams of composite resistors formed by different connections of constituent resistors in accordance with embodiments of the present disclosure.

FIG. 25 is an example circuit diagram illustrating a pair of composite transistors in accordance with embodiments of the present disclosure.

FIG. 26 is an example circuit diagram illustrating a pair of composite current sources in accordance with embodiments of the present disclosure.

FIG. 27 is an example circuit diagram illustrating a pair of composite capacitors in accordance with an embodiment of the present disclosure.

DETAILED DESCRIPTION

Embodiments are described that reduce differential element pair mismatch without incurring the area and fold-back trade-offs associated with conventional solutions. Embodiments are described that spectrally separate the mismatch-induced error of the different differential element pairs from each other and measure the spectrally separated mismatch-induced errors of each individual pair and compensate for the measured mismatch-induced errors. Spectrally separating the mismatch-induced error of one pair from mismatch-induced error of the remainder of the pairs means causing the mismatch-induced error of the one pair to appear in the output of the analog circuit at a different frequency band than one or more frequency bands at which mismatch-induced error of the remainder of the pairs appears. The spectral separation may involve chopping pairs of the analog circuit in various manners, e.g., chopping the one pair and not chopping the other pairs, not chopping the one pair and chopping the other pairs, and chopping different pairs at different chopping frequencies. The mismatch may manifest itself as input offset of a gain stage of the analog circuit, for example. Chopping to measure mismatch-induced error may itself introduce a small amount of error in the mismatch-induced error measurement. Embodiments are described that measure the chopping-induced error. The mismatch-induced error is measured at two distinct chopping frequencies and a difference of the two mismatch-induced error measurements if taken. The difference is used as a basis for measuring the chopping-induced error.

Figure 1:
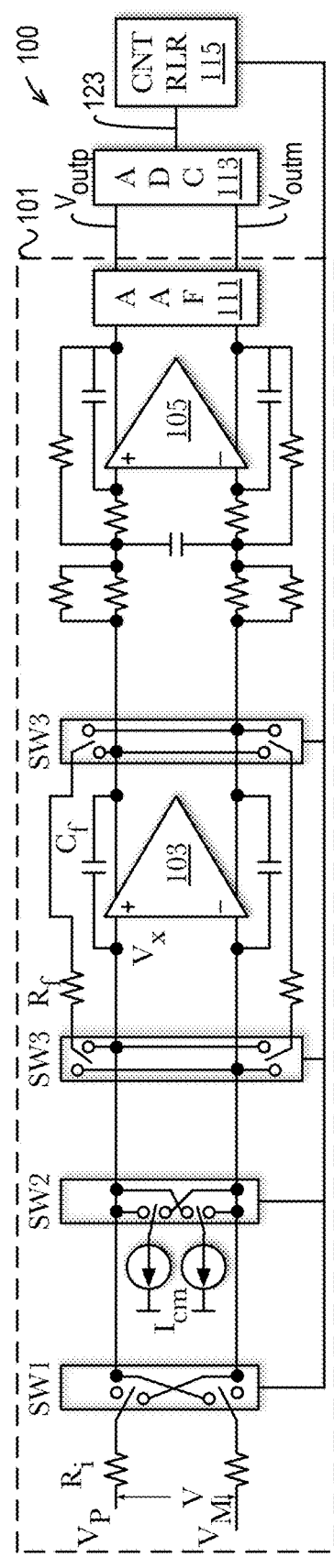
FIG. 1 is an example system that includes an analog circuit that has multiple differential element pairs in which the two elements in each pair are designed to match and that uses spectral separation to measure mismatch-induced error in the differential element pairs in accordance with embodiments of the present disclosure.

FIG. 1 is an example system 100 that includes an analog circuit that has multiple differential element pairs in which the two elements in each pair are designed to match and that uses spectral separation to measure mismatch-induced error in the differential element pairs in accordance with embodiments of the present disclosure. The system 100 includes the analog circuit 101 whose analog output $V_{out}$ (indicated as differential signals $V_{outp}$ and $V_{outm}$) is connected to the input of an analog-to-digital converter (ADC) 113 whose digital output 123 is connected to a controller 115. The analog circuit 101 includes a plurality of differential element pairs that are designed to match but which may have mismatches. Embodiments are contemplated in which mismatch-induced error may be measured for only a subset of all the differential element pairs of the analog circuit 101. The analog circuit 101 is configured with a chopping switch for each differential element pair whose mismatch-induced error is to be measured. In the example analog circuit 101 of FIG. 1, three chopping switches SW1, SW2 and SW3 are included for selectively chopping three respective differential element pairs: an input resistor pair $R_i$, a pull-down current source pair $I_{cm}$, and a feedback resistor pair $R_f$. That is, the chopping switches operate to swap, or alternate, the position of the two elements in the differential pair between the positive and negative positions in the differential circuit. The pull-down current source pair $I_{cm}$ may include matched transistors, for example.

In the example embodiment of FIG. 1, the analog circuit 101 may be employed as a current monitor circuit. For example, the current monitor may be employed to sense and measure a pulse-width-modulation (PWM) output current, or load current, driven through an output transducer (e.g., speaker) by a class-D amplifier, although the embodiments described are not limited to such an application but instead may be in any analog circuit, active or passive, that includes differential element pairs, such as an analog circuit including a gain stage. The current monitor analog front-end (AFE) chain includes an AFE gain stage, an anti-aliasing stage that includes an operational transconductance amplifier (OTA) 105, and an anti-aliasing filter (AAF) block 111 whose output $V_{out}$ is received by the ADC 113. The analog circuit 101 receives a differential input signal that is a voltage V that is a difference of respective positive and negative inputs $V_P$ and $V_M$.

The gain stage includes a differential operational transconductance amplifier (OTA) 103 having a summing node $V_x$ to which the input resistor $R_i$, pull-down current source $I_{cm}$, feedback resistor $R_f$, and feedback capacitor $C_f$ are connected. The input resistor $R_i$ and feedback resistor $R_f$ values set the signal gain of the gain stage. The pull-down current source $I_{cm}$ are used to level-shift the gain stage summing node voltages $V_x$. Mismatches in these elements may create a fully-differential frequency domain DC shift on the current monitor path and may also create a signal gain error. More specifically, mismatch of the differential input resistor pair $R_i$ and/or mismatch of the differential current source $I_{cm}$ of the gain stage may result in an input offset of the gain stage that may detrimentally affect the total harmonic distortion (THD) of the system 100. Additionally, mismatch of the differential feedback resistor pair $R_f$ of the gain stage may detrimentally affect the power supply rejection ratio (PSRR) of the system 100 and/or create non-linearities. These undesirable effects may change due to process-voltage-temperature (PVT) variations if they are not bounded.

Chopping switch SW1 operates to selectively connect the input resistor $R_i$ to the positive or negative summing node $V_x$; chopping switch SW2 operates to selectively connect the pull-down current source $I_{cm}$ to the positive or negative summing node $V_x$; and chopping switch SW3 operates to selectively connect the feedback resistor $R_f$ to the positive or negative summing node $V_x$ and to the positive or negative output of the OTA 103. In the example of FIG. 1, mismatch within the input resistor $R_i$, pull-down current source $I_{cm}$, and feedback resistor $R_f$ differential element pairs that are connected to the summing node $V_x$ of the gain stage may have a larger undesirable impact on performance of the system 100 since the gain stage mismatch-induced errors will not be attenuated, whereas mismatch-induced errors of other differential element pairs, e.g., of the anti-aliasing stage, will be attenuated by the gain of the gain stage. Stated alternatively, mismatch-induced errors at the gain stage will be gained up and may significantly impact the performance of the system 100. However, as described above, although chopping switches are included to spectrally separate and measure mismatch-induced errors of the three differential element pairs, other embodiments are contemplated in which the system 100 is configured to include chopping switches for different numbers of differential element pairs.

The current monitor in the system 100 is an example of an application in which the conventional chopping approach is not a good solution for reducing differential element pair mismatch because the nature of the input signal is such that it may be difficult to find an acceptable chopping frequency that does not fold back energy from the input signal back into the frequency band of interest. More specifically, the relatively high-frequency and high-power nature of the PWM load current that the system 100 is intended to measure may mean that there is significant energy at much of the frequency band of interest such that it may be difficult to find an effective chopping frequency for the conventional chopping method. However, advantageously, the embodiments described may be beneficially employed in such a system.

Figure 2:
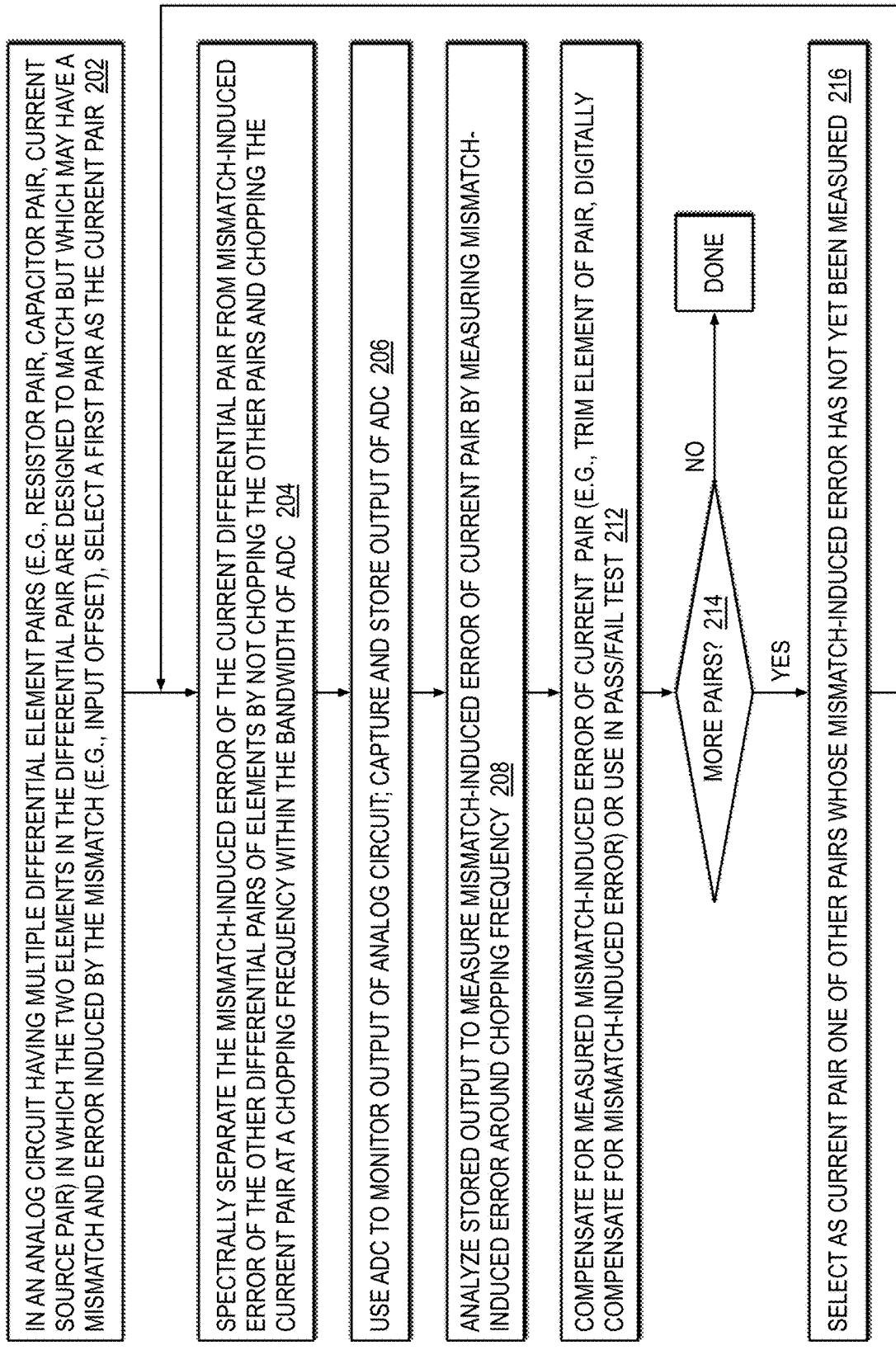
FIG. 2 is an example flowchart illustrating a method that uses spectral separation to measure a mismatch-induced error in a differential element pair in accordance with embodiments of the present disclosure.

FIG. 2 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 202.

At block 202, one of the differential element pairs is selected as the current pair whose mismatch-induced error is to be measured. For example, the input resistor $R_i$ pair may be selected as the current pair, although other pairs could be chosen. Operation proceeds to block 204.

Figure 3:
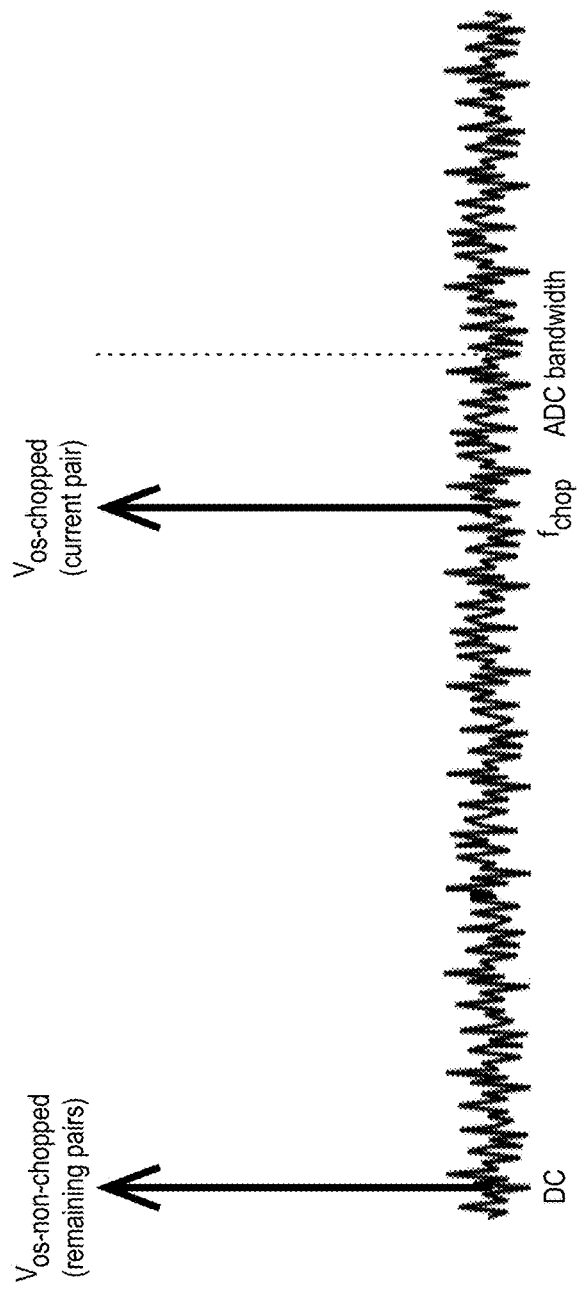
FIG. 3 is an example frequency spectrum graph illustrating operation of the method of FIG. 2.
Figure 4:
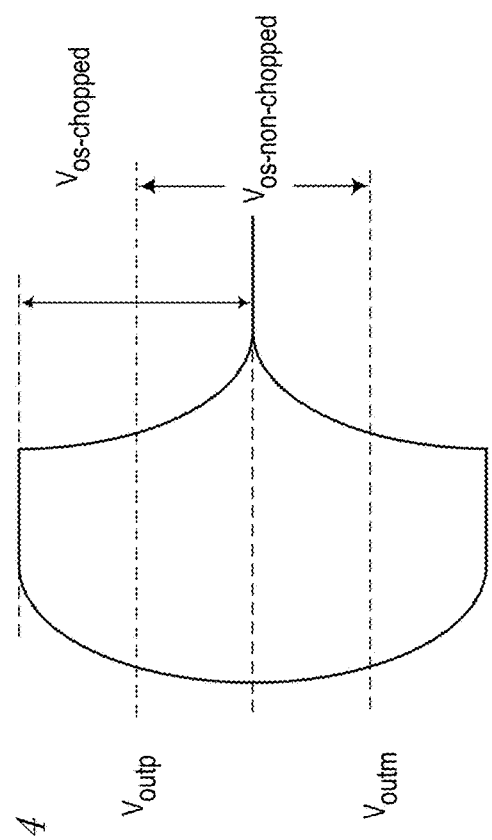
FIG. 4 is an example output voltage graph illustrating operation of the method of FIG. 2.
Figure 5A:
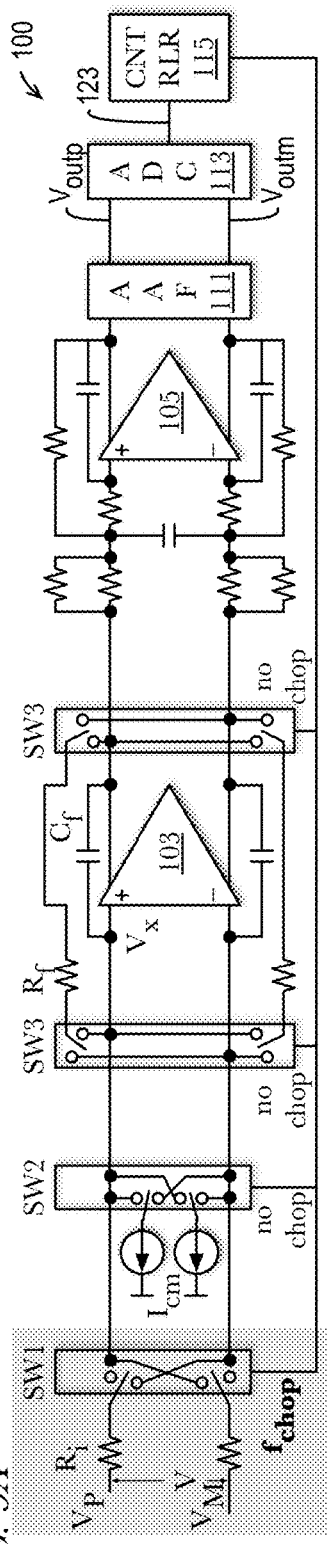
FIGS. 5A through 5C are examples of a system operating according to the method of FIG. 2.

At block 204, the mismatch-induced error of the current pair is spectrally separated from the mismatch-induced error of the remaining differential element pairs of the circuit by chopping the current pair and not chopping the remaining pairs. For example, if the input resistor $R_i$ pair is the current pair, then switch SW1 is operated at a chopping frequency whereas the other switches SW2 and SW3 corresponding to the current sources $I_{cm}$ and to the feedback resistor $R_f$ are not operated, i.e., they are kept in their default positions, as shown in FIG. 5A. The chopping frequency at which the current pair is chopped is a frequency that is within the measurement bandwidth of an ADC that monitors the output of the analog circuit while the spectral separation is being performed. Preferably, the input signal of the analog circuit (e.g., in the input voltage V of FIG. 1) is set to zero (e.g., $V_P$ and $V_M$ are tied to ground or to a power supply voltage) while the spectral separation is performed. As a result of the spectral separation of the mismatch-induced error of the current pair from the mismatch-induced errors of the remaining pairs, the current pair mismatch-induced error may be observed as a ripple at the analog circuit output around the chopping frequency used to chop the current pair, whereas the mismatch-induced errors of the remaining pairs remain as a frequency domain DC shift at the analog circuit output, as shown in FIGS. 3 and 4. The error may settle to its final value substantially within a time constant which, in the example of FIG. 1, may be the product of the feedback resistance and capacitance of the gain stage. Operation proceeds to block 206.

At block 206, the ADC monitors the output of the analog circuit, and the ADC output is captured and stored (e.g., in a memory accessible to a controller, e.g., controller 115 of FIG. 1, that captures the ADC output). Operation proceeds to block 208.

At block 208, the stored output is analyzed (e.g., by the controller 115 of FIG. 1) to measure the mismatch-induced error of the current pair. In one embodiment, a digital notch filter may be applied to the stored digital output around the chopping frequency used at block 204 to measure the mismatch-induced error of the current pair. In one embodiment, a Fast Fourier Transform (FFT) may be applied to the stored digital output to measure the mismatch-induced error of the current pair around the chopping frequency used at block 204. In one embodiment, a peak-to-peak measurement of the stored digital output may be observed to measure the mismatch-induced error of the current pair. Operation proceeds to block 212.

At block 212, the measured mismatch-induced error of the current pair is compensated. In one embodiment, the compensation comprises applying a calibration code to one of the elements of the pair, e.g., trimming a resistor, capacitor or current source transistor. In such embodiment, the calibration code may be stored based on the mismatch-induced error measured at block 208 during test of the system, and then the calibration code may be applied during normal operation of the system. Additionally, the compensation may be applied to the current pair prior to looping back to block 204 to measure the mismatch-induced error of the next differential element pair. In one embodiment, the compensation comprises digitally compensating for the mismatch-induced error. To illustrate by example, assume the measured mismatch-induced error is an input offset value caused by the current pair mismatch. The current pair input offset value may be stored during test of the system and subsequently, during normal operation of the system, subtracted from the ADC output. Additionally, the digital compensation may be applied to the current pair prior to looping back to block 204 to measure the mismatch-induced error of the next differential element pair. In another embodiment, the mismatch-induced error may be measured according to blocks 204 through 208 during normal operation and then the compensation may be performed. For example, if the chopping frequency is within the ADC bandwidth but outside the frequency band of interest, then the output may be low pass filtered and the mismatch-induced error may still be measured using the ADC and used to compensate. Alternatively, rather than compensating, the measured mismatch-induced error may be used to make a pass/fail determination during product test of an integrated circuit that includes the analog circuit. For example, if the mismatch-induced error exceeds a threshold, the integrated circuit may fail the test. Operation proceeds to decision block 214.

Figure 5B:
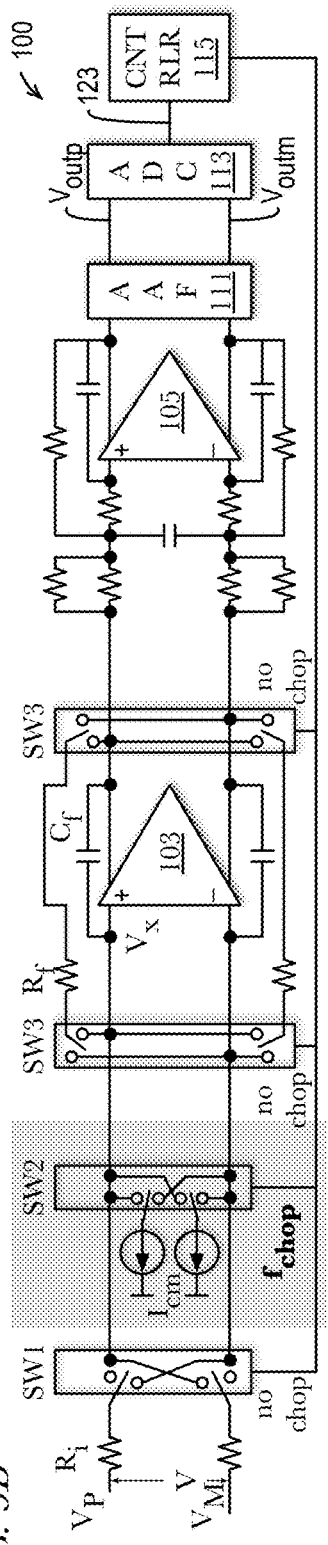
Figure 5C:
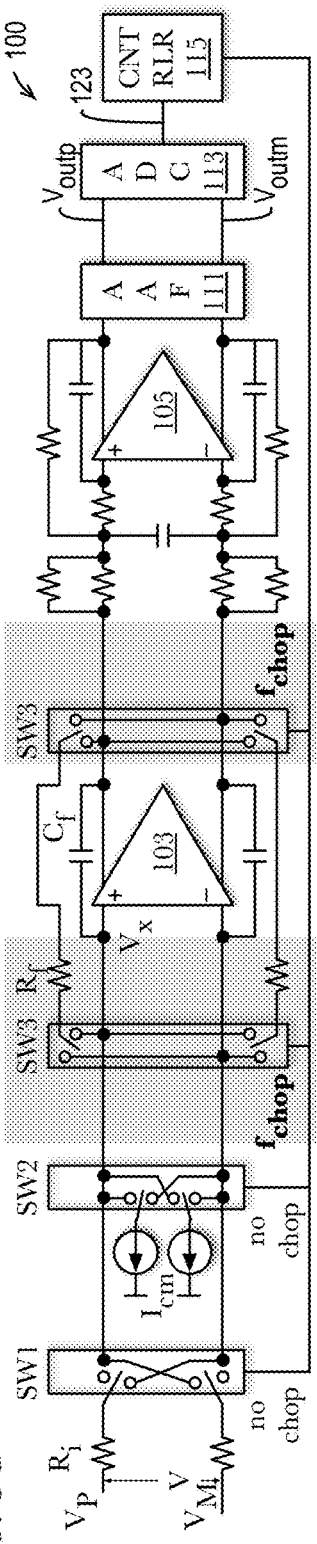

At decision block 214, if there are more differential element pairs whose mismatch-induced errors need to be measured, a next pair is selected as the current pair at block 216, and operation returns to block 204. For example, if the input resistor $R_i$ pair of FIG. 1 were chosen at block 202 as shown in FIG. 5A, then the feedback resistor $R_f$ pair could be chosen for the next iteration of blocks 204 through 212 as shown in FIG. 5B, and the current source pair cm may be chosen for the third iteration as shown in FIG. 5C. The loop continues for all differential element pairs for which the mismatch-induced error is to be determined via the spectral separation method.

Figure 6:
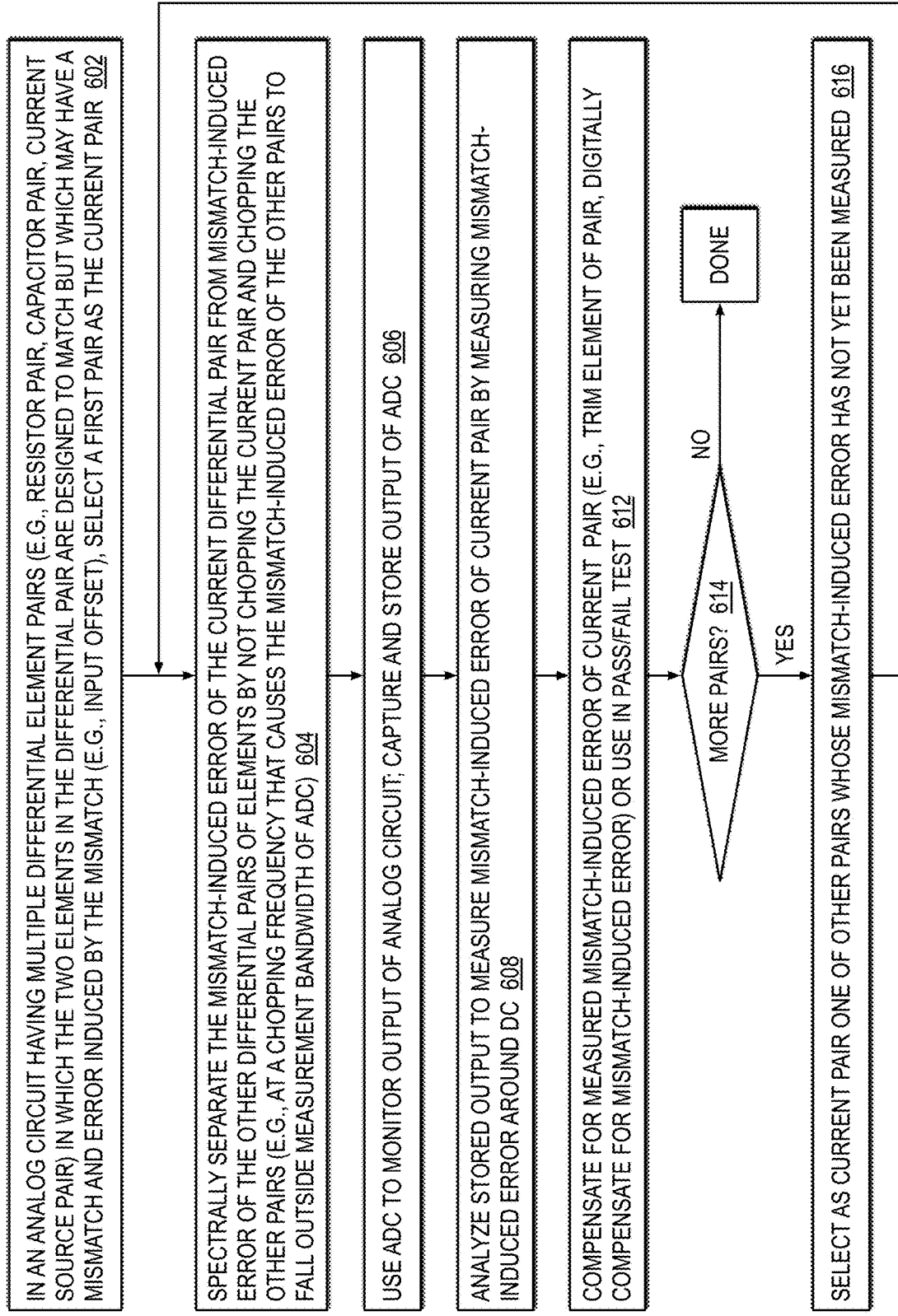
FIG. 6 is an example flowchart illustrating a method that uses spectral separation to measure a mismatch-induced error in a differential element pair in accordance with embodiments of the present disclosure.

FIG. 6 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 602.

At block 602, one of the differential element pairs is selected as the current pair whose mismatch-induced error is to be measured. For example, the input resistor $R_i$ pair may be selected as the current pair, although other pairs could be chosen. Operation proceeds to block 604.

Figure 7:
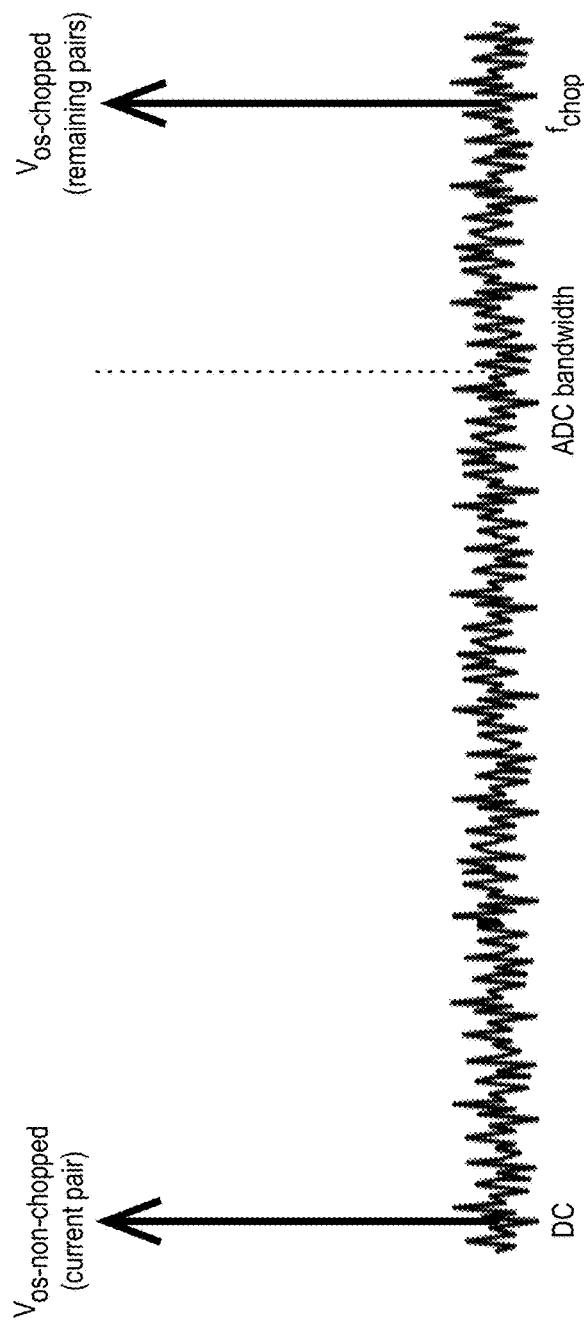
FIG. 7 is an example frequency spectrum graph illustrating operation of the method of FIG. 6.
Figure 8:
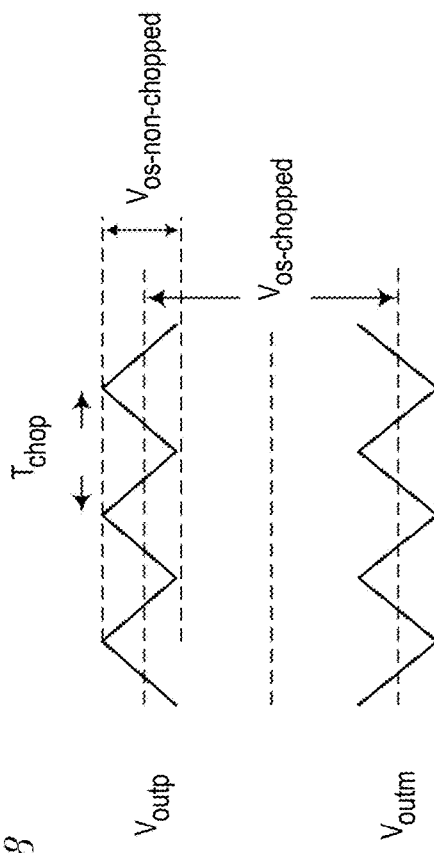
FIG. 8 is an example output voltage graph illustrating operation of the method of FIG. 6.

At block 604, the mismatch-induced error of the current pair is spectrally separated from the mismatch-induced error of the remaining differential element pairs of the circuit by not chopping the current pair and chopping the remaining pairs. Thus, the embodiment of FIG. 6 is effectively the inverse of the embodiment of FIG. 2. For example, if the input resistor $R_i$ pair is the current pair, then switch SW1 is not operated, i.e., kept in its default position, whereas the other switches SW2 and SW3 corresponding to the current sources $I_{cm}$ and to the feedback resistor $R_f$ are operated at a chopping frequency, as shown in FIG. 5A. Preferably, the chopping frequency at which the current pair is chopped is a frequency that is outside the measurement bandwidth of an ADC that monitors the output of the analog circuit while the spectral separation is being performed. In one embodiment, the ADC is an oversampling ADC. Preferably, the input signal of the analog circuit (e.g., in the input voltage V of FIG. 1) is set to zero (e.g., $V_P$ and $V_M$ are tied to ground or to a power supply voltage) while the spectral separation is performed. As a result of the spectral separation of the mismatch-induced error of the current pair from the mismatch-induced errors of the remaining pairs, the current pair mismatch-induced error remains as a frequency domain DC shift at the analog circuit output, whereas the mismatch-induced errors of the remaining pairs may be observed as a ripple at the analog circuit output around the chopping frequency used to chop the remaining pairs, as shown in FIGS. 7 and 8. The error may settle to its final value substantially within a time constant which, in the example of FIG. 1, may be the product of the feedback resistance and capacitance of the gain stage. Operation proceeds to block 606.

At block 606, the ADC monitors the output of the analog circuit, and the ADC output is captured and stored (e.g., in a memory accessible to a controller, e.g., controller 115 of FIG. 1, that captures the ADC output). Operation proceeds to block 608.

At block 608, the stored output is analyzed to measure the mismatch-induced error of the current pair. In one embodiment, a digital notch filter may be applied to the stored digital output around DC to measure the mismatch-induced error of the current pair. In one embodiment, a Fast Fourier Transform (FFT) may be applied to the stored digital output to measure the mismatch-induced error of the current pair around DC. In one embodiment, a peak-to-peak measurement of the stored digital output may be observed to measure the mismatch-induced error of the current pair. Operation proceeds to block 612.

At block 612, the measured mismatch-induced error of the current pair is compensated or used to make a product test pass/fail determination, similar to that described above with respect to block 212 of FIG. 2. Operation proceeds to decision block 614.

Figure 9A:
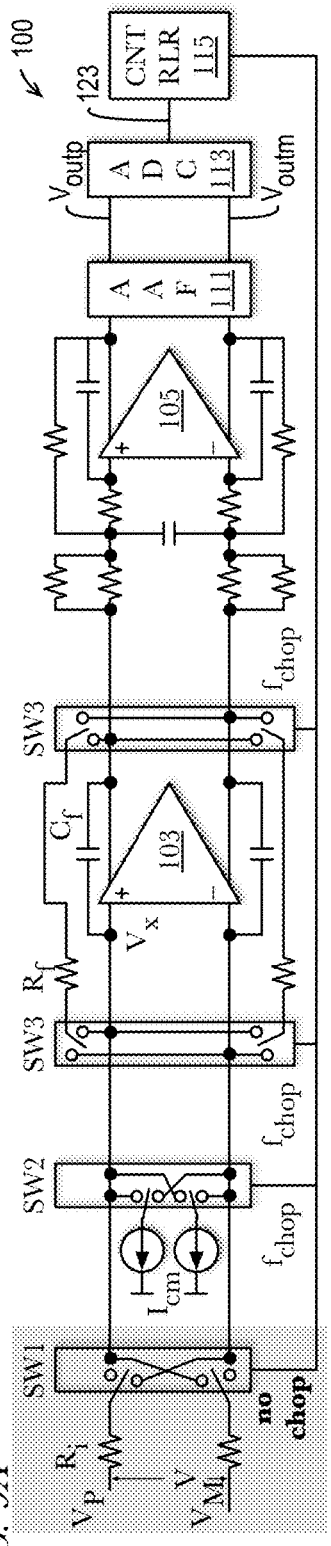
FIGS. 9A through 9C are examples of a system operating according to the method of FIG. 6.
Figure 9B:
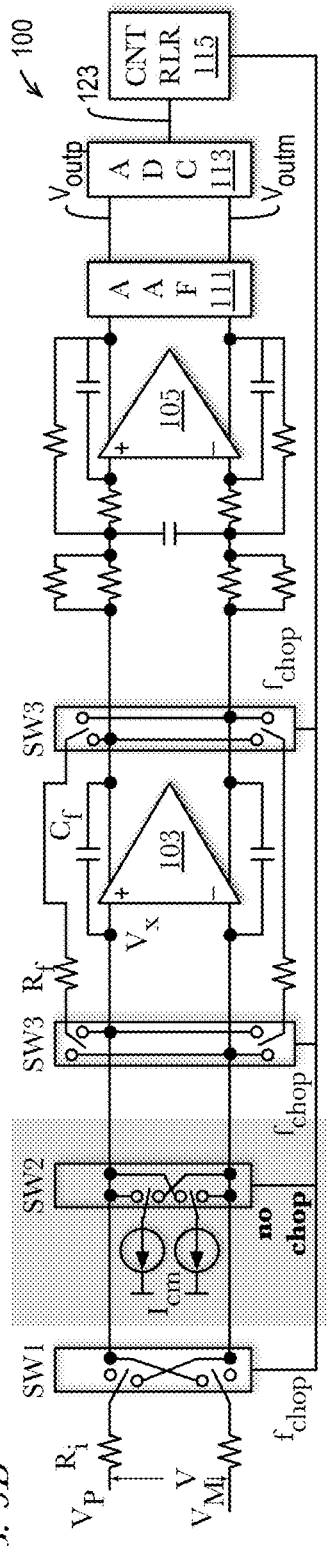
Figure 9C:
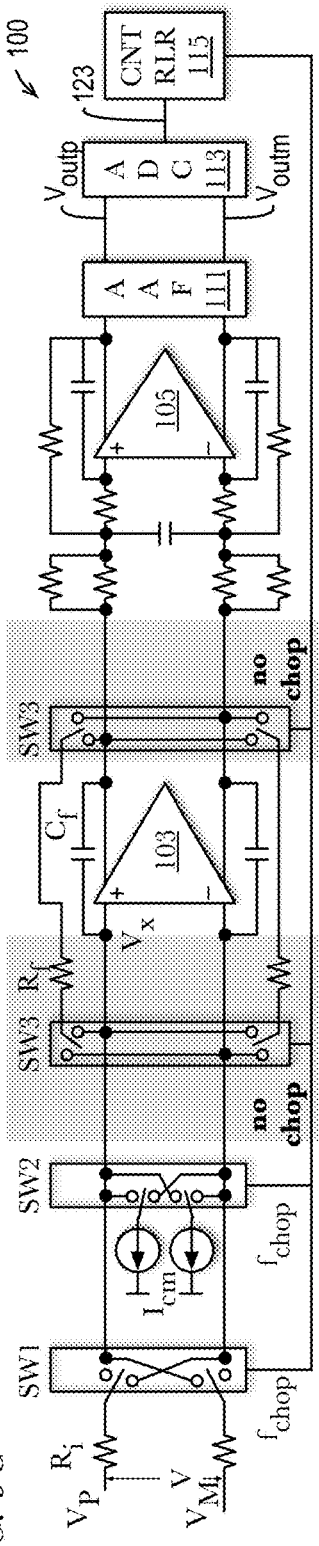

At decision block 614, if there are more differential element pairs whose mismatch-induced errors need to be measured, a next pair is selected as the current pair at block 616, and operation returns to block 604. For example, if the input resistor $R_i$ pair of FIG. 1 were chosen at block 602 as shown in FIG. 9A, then the feedback resistor $R_f$ pair could be chosen for the next iteration of blocks 604 through 612 as shown in FIG. 9B, and the current source pair $I_{cm}$ could be chosen for the third iteration as shown in FIG. 9C. The loop continues for all differential element pairs for which the mismatch-induced error is to be determined via the spectral separation method.

Figure 10:
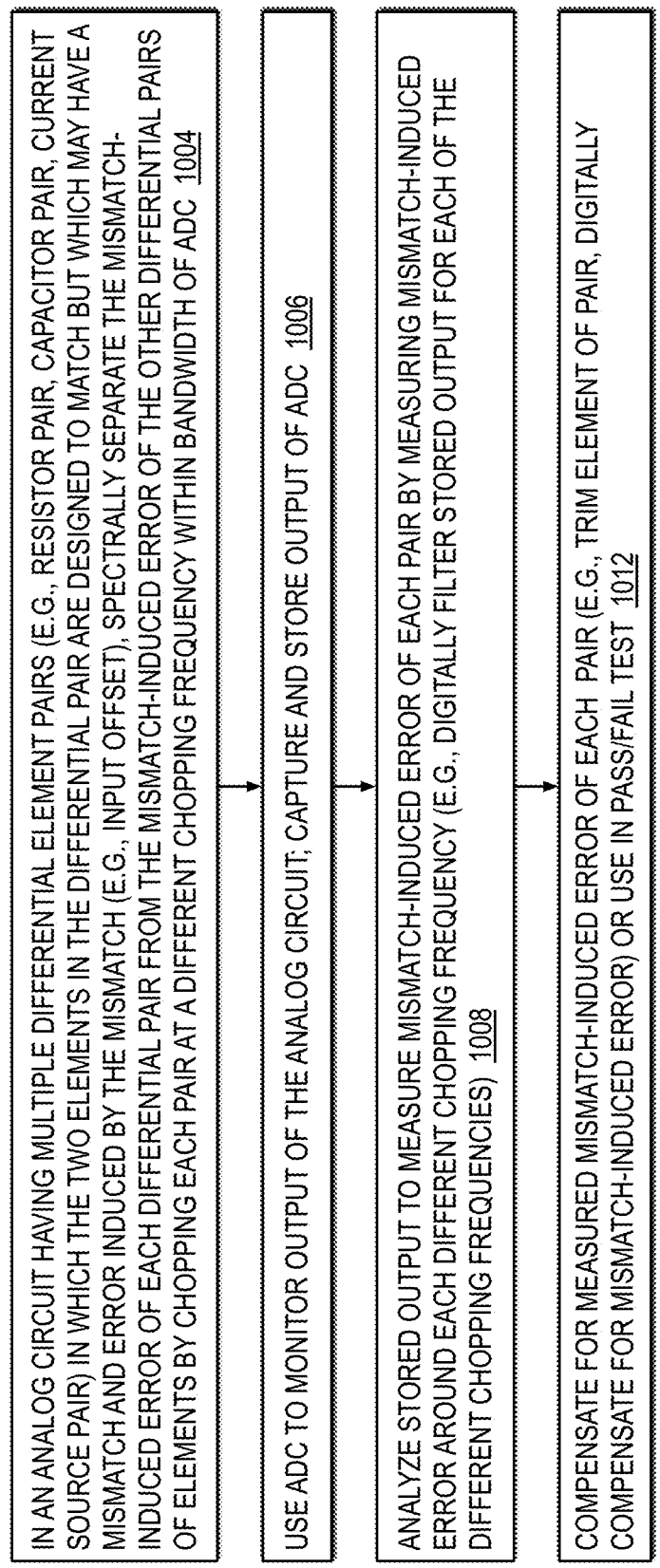
FIG. 10 is an example flowchart illustrating a method that uses spectral separation to measure a mismatch-induced error in a differential element pair in accordance with embodiments of the present disclosure.

FIG. 10 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 1004.

Figure 11:
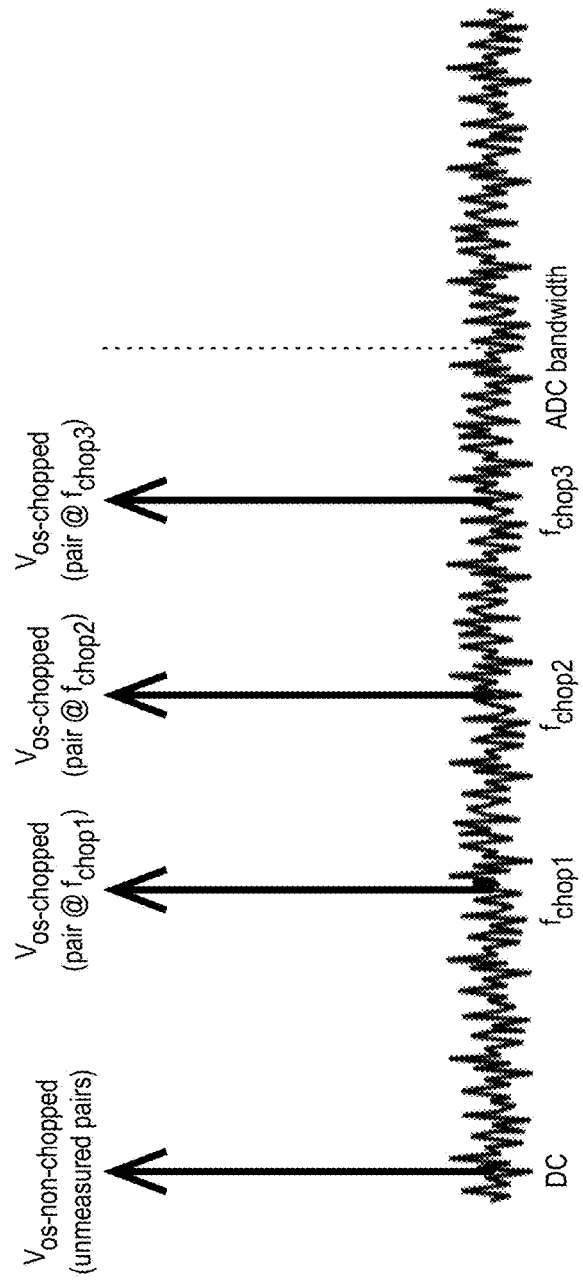
FIG. 11 is an example frequency spectrum graph illustrating operation of the method of FIG. 10.
Figure 12:
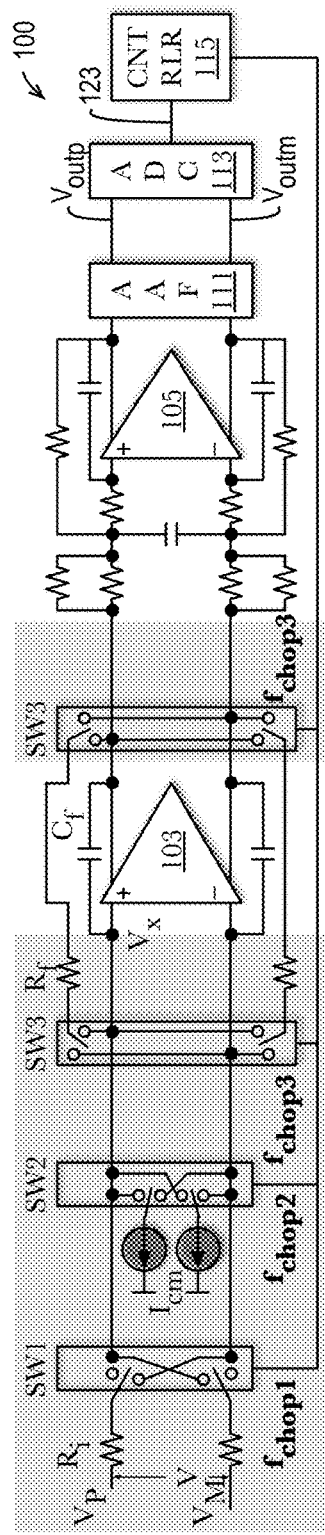
FIG. 12 is an example of a system operating according to the method of FIG. 10.

At block 1004, each pair of the differential element pairs whose mismatch-induced error is to be measured is chopped at a distinct chopping frequency within the bandwidth of the ADC in order to spectrally separate the mismatch-induced error of each chopped pair from the mismatch-induced error of the remaining differential element pairs of the circuit. For example, the input resistor $R_i$ pair may be chopped via switch SW1 at a first chopping frequency $F_{chop1}$, the current sources $I_{cm}$ pair may be chopped via switch SW2 at a second chopping frequency $F_{chop2}$, and the feedback resistor $R_f$ pair may be chopped via switch SW3 at a third chopping frequency $F_{chop3}$, as shown in FIGS. 11 and 12, in which $F_{chop1}$, $F_{chop2}$, and $F_{chop3}$ are distinct and sufficiently separated within the frequency spectrum such that the mismatch-induced error of each chopped pair are separately observable at the analog circuit output. As a result of the spectral separation of the mismatch-induced error of the each of the chopped pairs from the mismatch-induced errors of the remaining pairs, the mismatch-induced error of non-chopped differential element pairs remains as a frequency domain DC shift at the analog circuit output, whereas the mismatch-induced errors of the chopped pairs may be observed as a ripple at the analog circuit output around the distinct chopping frequency used to chop the respective pair, as shown in FIG. 11. Operation proceeds to block 1006.

At block 1006, the ADC monitors the output of the analog circuit, and the ADC output is captured and stored (e.g., in a memory accessible to a controller, e.g., controller 115 of FIG. 1, that captures the ADC output). Operation proceeds to block 1008.

At block 1008, the stored output is analyzed to measure the mismatch-induced error of each chopped pair. In one embodiment, multiple digital notch filters may be applied to the stored digital output around each of the chopping frequencies used at block 1004 to measure the mismatch-induced error of each pair. In one embodiment, a Fast Fourier Transform (FFT) may be applied to the stored digital output to measure the mismatch-induced error of each pair around each of the chopping frequencies used at block 1004. Operation proceeds to block 1012.

At block 1012, the measured mismatch-induced error of each pair measured at block 1008 is compensated or used to make a product test pass/fail determination, similar to that described above with respect to block 212 of FIG. 2.

Figure 13:
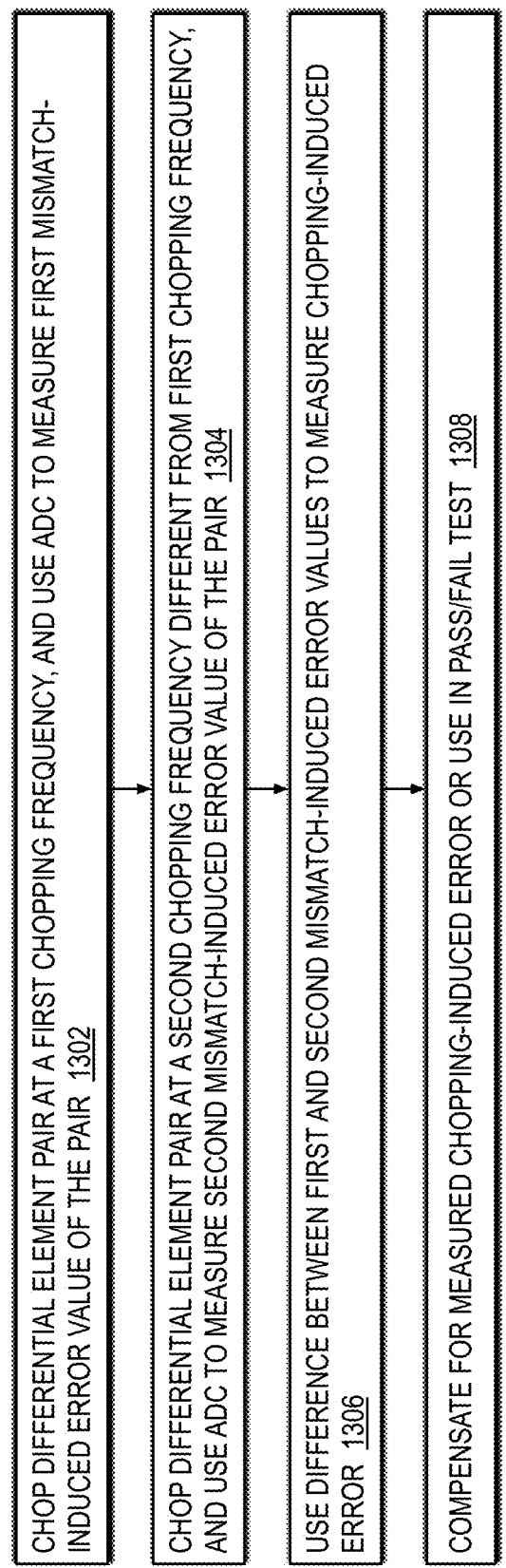
FIG. 13 is an example flowchart illustrating a method that measures chopping-induced error in accordance with embodiments of the present disclosure.

FIG. 13 is an example flowchart illustrating a method, for use in a system having an analog circuit that has at least one differential element pair in which each element in a pair is designed to match, that measures chopping-induced error in accordance with embodiments of the present disclosure. Causes of chopping-induced error may be switch-on resistance of the chopping switches, additional parasitic or coupling capacitance introduced by the chopping switches, among others. The system 100 of FIG. 1 is an example of a system in which the method may be applied, although the method may be applied to measure chopping-induced error in any analog circuit. The method may be used in conjunction with any of the embodiments described above for measuring mismatch-induced error of differential element pairs. Additionally, the method may be used to measure chopping-induced error in other applications in which chopping is employed, e.g., in conjunction with a conventional chopping application that chops the differential element pairs and filters the frequency-shifted output. Operation begins at block 1302.

At block 1302, a differential element pair (e.g., the input resistor $R_i$ pair of FIG. 1) is chopped at a first chopping frequency (e.g., via switch SW1) similar to the operation at block 204 of FIG. 2, and an ADC (e.g., ADC 113 of FIG. 1) is used to measure the first mismatch-induced error value of the pair similar to the operation at blocks 206 and 208 of FIG. 2. Operation proceeds to block 1304.

At block 1304, the differential element pair of block 1302 is chopped at a second chopping frequency distinct from the first chopping frequency used at block 1302, and the ADC is used to measure a second mismatch-induced error value of the pair. Operation proceeds to block 1306.

At block 1306, a difference between the first and second mismatch-induced error values is computed and used to measure a chopping-induced error. Operation proceeds to block 1308.

At block 1308, the measured chopping-induced error of the pair is compensated. In one embodiment, the compensation comprises digitally compensating for the chopping-induced error. For example, the measured chopping-induced error value may be stored during test of the system and subsequently, during normal operation of the system, subtracted from the ADC output. Alternatively, rather than compensating, the measured mismatch-induced error may be used to make a pass/fail determination during product test of an integrated circuit that includes the analog circuit. For example, if the chopping-induced error exceeds a threshold, the integrated circuit may fail the test.

Circuit Element Pair Matching

As described above, the design of a circuit may rely on pairs of circuit elements to have matched characteristics, e.g., resistors to have matched resistance values, capacitors to have matched capacitance values, current sources to have matched output currents, and transistors to have matched transconductances and/or threshold voltages. If the resistances, for example, of the pair do not match, then the circuit that includes them may not operate as desired or may operate in a sub-optimal fashion. Embodiments are now described for matching a circuit element pair that includes fabricating N constituent circuit elements and switch networks, to which each terminal of the N circuit elements are connected, that are configurable in M different combinations to form a pair of composite circuit elements each of mutually exclusive sets of N/2 of the N circuit elements. As an example, embodiments are described for matching resistances of a resistor pair that includes fabricating N constituent resistors and switch networks, to which each terminal of the N resistors are connected, that are configurable in M different combinations to form a pair of composite resistors each of mutually exclusive sets of N/2 of the N resistors. The switches are configured, according to a first combination of the M combinations, to form the composite resistor pair and the mismatch of the composite pair formed according to the first combination is measured and stored. The mismatch may be measured directly, or the mismatch may be measured indirectly as another characteristic of the circuit that indicates the mismatch of the formed composite resistors, which are included in the circuit. For example, the mismatch-indicating characteristic may be measured using the spectral separation method described above, e.g., a portion of an offset attributable to the mismatch of the composite resistor pair. Next, the switches are configured according to a second combination of the M combinations to form the pair of composite resistors and the mismatch is measured and stored. This process is repeated for the M combinations. Then, the combination with the best mismatch measurement is chosen as the final combination. Finally, the switch networks are configured with the chosen final combination for use of the circuit in mission mode, e.g., during operation by a user of a device that includes the circuit that includes the composite resistors formed by the final combination in contrast to a calibration mode in which the final combination is being determined, e.g., during production test or at power-up or reset of the device by the user. Advantageously, the switch networks may also be employed to perform chopping to accomplish the spectral separation during calibration mode. Additionally, to further mitigate any remaining mismatch in the composite resistors, the composite resistors may be chopped during mission mode using the final combination of switch networks alternated with the inverse thereof accompanied by de-chopping of the output of the circuit.

FIG. 14 is a prior art circuit diagram illustrating a pair of resistors Rp and Rm that have respective input terminals inp and inm and that have respective output terminals outp and outm for connection within a circuit, such as a differential amplifier. Each resistor of the pair of resistors Rp and Rm is designed to have a resistance value generally referred to as Q ohms, i.e., they are designed to have matching resistance. The resistors Rp and Rm may be fabricated on an integrated circuit, and each has a length L and a width W, as shown. The ratio of the length and width L/W generally affects the resistance of the resistors (along with the material from which they are fabricated, among others). Generally speaking, the greater the L/W ratio, the higher the resistance of the resistor. Because it is the ratio L/W of the resistor that affects its resistance, a resistor having a ratio of 100 whose actual length is 200 units and actual width is 2 units will generally have the same resistance as a resistor having a ratio of 100 whose actual length is 1000 units and actual width is 10 units. That is, resistors may have the same resistance even though their areas may be significantly different.

As is well known in the art of fabricating resistors on integrated circuits, the actual resistance value of a fabricated resistor may vary from its designed value due to variances in the actual length and/or width from the specified values, among other factors. Because the variance in length and width are generally speaking not affected by the size of the resistor—i.e., the designed length and width do not generally affect the amount of variance—one method of reducing the amount of mismatch in a resistor pair is to fabricate large resistors rather than small resistors. To illustrate using the example above, assume in the first scenario that one of the resistors of the pair is actually fabricated 201 units long and 2 units wide and the other resistor in the pair is actually fabricated 199 units long and 2 units wide. In that case, the resistances of the resistors in the pair mismatch by about 1%. Then, assume in the second scenario that one of the resistors of the pair is actually fabricated 1001 units long and 10 units wide and the other resistor in the pair is actually fabricated 999 units long and 10 units wide. In that case, the resistances of the resistors in the pair mismatch by about 0.2%.

As may be observed, increasing the area of a pair of resistors may help achieve a desired level of mismatch. However, area may be a precious resource on an integrated circuit, and it is desirable to attain required levels of mismatch without requiring significant area increase. Embodiments are described below that advantageously improve the matching of a resistor pair for an area allotted to the pair and/or that advantageously improve the area used for a target level of mismatch. Simulations have shown a statistical improvement indicated by a resistance mismatch standard deviation ratio for a large sample size (e.g., one million) of approximately 4.6 between an embodiment (e.g., of FIGS. 20A through 20C) and a conventional resistor pair given the same area. The improvement may alternatively be appreciated as a 21 times reduction in area relative to the conventional approach for an equivalent resistance mismatch standard deviation.

FIG. 15 is an example circuit diagram illustrating a pair of composite resistors Rcp and Rcm in accordance with embodiments of the present disclosure. The composite resistors Rcp and Rcm have respective input terminals inp and inm and have respective output terminals outp and outm for connection within a circuit. Each composite resistor of the pair of composite resistors Rcp and Rcm is designed to have an equivalent matching resistance value generally referred to as Q ohms, for illustration by comparison with the pair of resistors Rp and Rm of FIG. 14. The composite resistor pair Rcp and Rcm is designed to be configurable to have matching resistances for use within the circuit. For example, the composite resistors Rcp and Rcm may be used on associated positive and negative nodes of a differential circuit, such as the input resistors $R_i$ or feedback resistors $R_f$ of a differential gain stage described above, although the resistor matching embodiments described herein may be employed in any function or any circuit in which a resistor pair with matching resistances are needed.

For use in forming the composite resistors Rcp and Rcm, a set of N resistors 1508, referred to as constituent resistors 1508, each designed to have the same resistance (N/2)*Q (i.e., the product of one-half N and Q) is fabricated on the integrated circuit. In the example of FIG. 15, N is 8, and each constituent resistor 1508 is designed to have a resistance value of 4×Q ohms for forming composite resistors Rcp and Rcm each having an equivalent resistance of Q ohms. In FIG. 15, the 8 constituent resistors are referred to as R1, R2, R3, R4, R5, R6, R7 and R8. In the example of FIG. 15, each of the constituent resistors 1508 has a length of L and a width of W/4, which is useful to illustrate that the N constituent resistors 1508 may occupy approximately the same area as two conventional resistors as shown in FIG. 14 and yet provide improved matching, as described in more detail below. However, other embodiments are contemplated in which the constituent resistors 1508 are shaped differently than shown (i.e., that have dimensions different than L×W/N) and yet have a resistance of (N/2)*Q.

A first switch network 1502i is fabricated to connect to the input terminal of each of the N constituent resistors 1508, and a second switch network 1502o is fabricated to connect to the output terminal of each of the N constituent resistors 1508. The switch networks are referred to collectively as switch networks 1502 and individually generically as a switch network 1502. The input switch network 1502i has the input terminals inp and inm, and the output switch network 1502o has the respective output terminals outp and outm. The individual switches of the switch networks 1502 may be transistors, such as MOSFET transistors, fabricated on the integrated circuit. Generally speaking, advantageously the transistor switch networks 1502 may be fabricated on the integrated circuit within a very small area relative to the area within which the set of N constituent resistors 1508 are fabricated. In other words, in FIG. 15 the size of the switch networks 1502 is not drawn to scale relative to the size of the constituent resistors 1508. Additionally, the resistance of the switches is typically small relative to the resistance of the constituent resistors 1508. Still further, variation in the resistances of the switches of the switch networks 1502 may be accounted for during the measurement and choosing of the final combination, as described in more detail below.

The switch networks 1502 are dynamically configurable by a controller 1504 that provides a combination signal 1506 to the switch networks 1502 that specifies how the switch networks 1502 are configured to connect which of the constituent resistors 1508 to which of the input/output pairs inp/outp and inm/outm to form the composite resistors Rcp and Rcm, examples of which are shown in FIGS. 16A-16F and described below. That is, the combination 1506 is a control signal to the switches 1502 that determines which of the N/2 constituent resistors 1508 are connected to the inp and outp terminals and which of the remaining N/2 constituent resistors 1508 are connected to the inm and outm terminals. In one embodiment, the controller 1504 may be part of a test system external to the integrated circuit that includes the composite resistors Rcp and Rcm and that is employed in a calibration mode during production of the integrated circuit, and once the controller 1504 has chosen the final combination, as described more herein, the controller 1504 sets the final combination of the switch networks 1502 for subsequent use in a mission mode of the integrated circuit by a user of a device or system that includes the integrated circuit. However, in other embodiments, the controller 1504 is fabricated as part of the integrated circuit and may be used to configure the switch networks 1502 not only during production test, but also during use by the user in a calibration mode and, in some embodiments, during mission mode.

Each of the composite resistors Rcp and Rcm is formed by mutually exclusive sets of N/2 of the N constituent resistors 1508 that is specified by the combination 1506. In one embodiment, the constituent resistors 1508 are combined in parallel, e.g., as described with respect to FIG. 19 and as shown in FIGS. 16A through 16F. In another embodiment, the constituent resistors 1508 are combined in series, e.g., as described with respect to FIGS. 22 through 24.

FIGS. 16A through 16F illustrate six different example combinations 1506 of the constituent resistors 1508 via the switch networks 1502 of FIG. 15. In FIGS. 16A through 16F, composite resistor Rcp includes the shaded constituent resistors 1508, and composite resistor Rcm includes the non-shaded constituent resistors 1508. In the combination 1506 of FIG. 16A, constituent resistors R1, R3, R4 and R6 are connected in parallel by the switch networks 1502 to form composite resistor Rcp and constituent resistors R2, R5, R7 and R8 are connected in parallel by the switch networks 1502 to form composite resistor Rcm. In the combination 1506 of FIG. 16B, constituent resistors R1, R2, R3 and R4 are connected in parallel by the switch networks 1502 to form composite resistor Rcp and constituent resistors R5, R6, R7 and R8 are connected in parallel by the switch networks 1502 to form composite resistor Rcm. In the combination 1506 of FIG. 16C, constituent resistors R1, R4, R5 and R8 are connected in parallel by the switch networks 1502 to form composite resistor Rcp and constituent resistors R2, R3, R6 and R7 are connected in parallel by the switch networks 1502 to form composite resistor Rcm. In the combination 1506 of FIG. 16D, constituent resistors R1, R4, R6 and R7 are connected in parallel by the switch networks 1502 to form composite resistor Rcp and constituent resistors R2, R3, R5 and R8 are connected in parallel by the switch networks 1502 to form composite resistor Rcm. In the combination 1506 of FIG. 16E, constituent resistors R5, R6, R7 and R8 are connected in parallel by the switch networks 1502 to form composite resistor Rcp and constituent resistors R1, R2, R3 and R4 are connected in parallel by the switch networks 1502 to form composite resistor Rcm. In the combination 1506 of FIG. 16F, constituent resistors R2, R3, R6 and R7 are connected in parallel by the switch networks 1502 to form composite resistor Rcp and constituent resistors R1, R4, R5 and R8 are connected in parallel by the switch networks 1502 to form composite resistor Rcm.

Figure 16A:
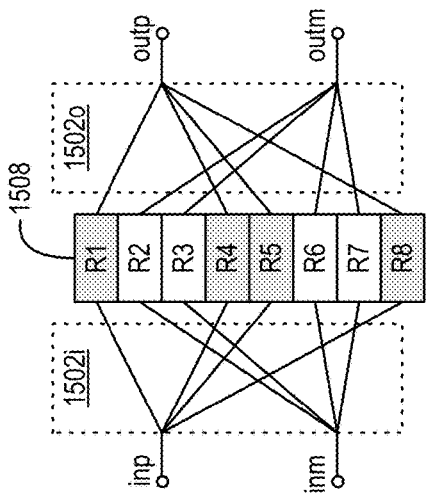
FIGS. 16A through 16F are diagrams of composite resistors formed by different connections of constituent resistors in accordance with embodiments of the present disclosure.
Figure 16B:
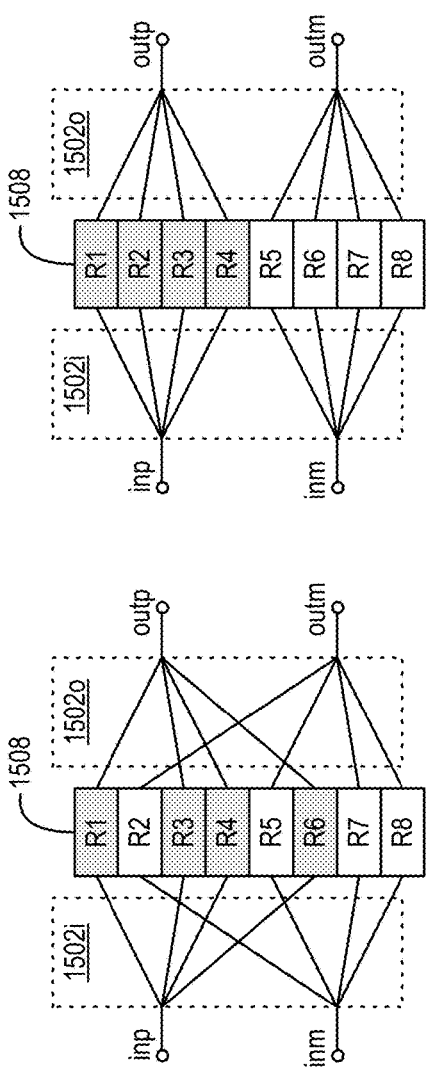
Figure 16C:
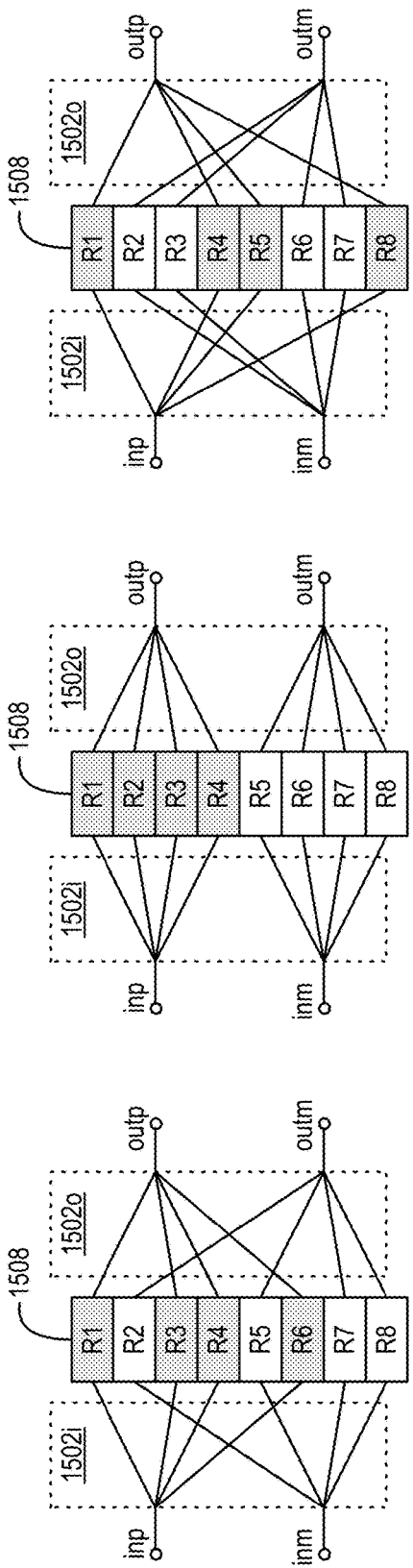
Figure 16D:
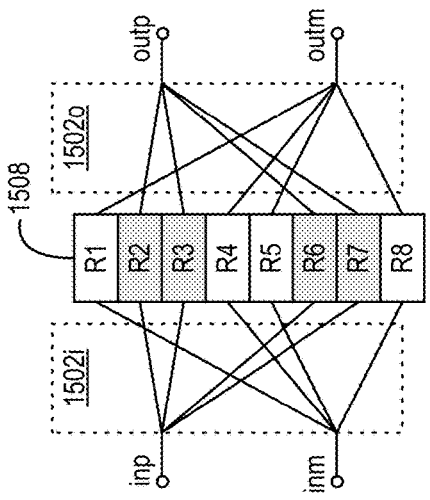
Figure 16E:
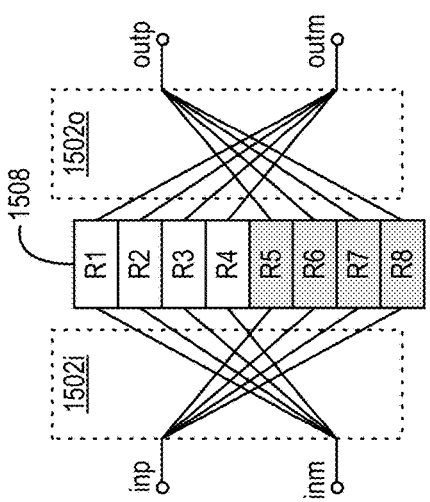
Figure 16F:
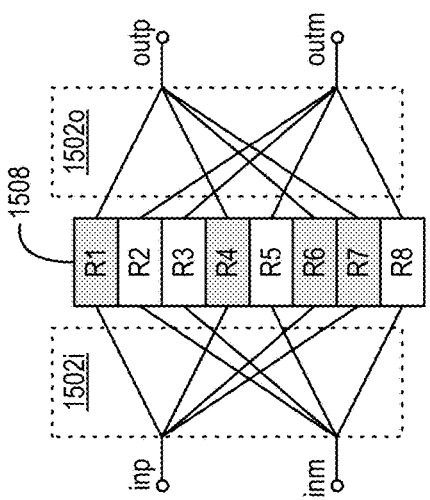

As may be observed, the combinations 1506 of FIGS. 16B and 16E are inverses of one another. Stated alternatively, the input/output pairs inp/outp and inm/outm to which the two different mutually exclusive sets of constituent resistors 1508 are connected by the switch networks 1502 are swapped between the combination 1506 of FIG. 16B and the combination 1506 of FIG. 16E. In other words, the composite resistors Rcp and Rcm are swapped between the combinations 1506 of FIGS. 16B and 16E, which may be useful for chopping the composite resistors Rcp and Rcm, e.g., to perform spectral separation and/or as a supplement to composite resistor Rcp and Rcm matching, as described in more detail below with respect to FIG. 21. Similarly, the combinations of FIGS. 16C and 16F are inverses of one another.

It may further be observed that the combinations 1506 of FIGS. 16A, 16B, 16D and 16E conform to a limited set of combinations 1506 that may be imposed by the switch network 1502. More specifically, embodiments are contemplated (e.g., as described with respect to FIGS. 20A-20C) in which the switch network 1502 are fabricated such that each constituent resistor 1508 has a corresponding constituent resistor 1508 that forms a constituent resistor pair, and for each constituent resistor pair, one resistor must be part of formed composite resistor Rcp and the other resistor must be part of formed composite resistor Rcm. In such an embodiment of the switch network 1502, the number of possible combinations $M=2^{(N/2)}$ (i.e., 2 to the power one-half N), which is 16 in the example embodiment of FIG. 15 in which N=8. This is in contrast to other embodiments that enable different numbers of possible combinations, such as an embodiment of the switch network 1502 that may be configured in all possible combinations of the N constituent resistors 1508, which is $M=N!/((N/2)!(N/2)!)$ (i.e., N factorial divided by the square of one-half N factorial), and which is 70 in the example embodiment of FIG. 15 in which N=8. To illustrate by another example in which N is 6, the limited set of combinations with the embodiment described above may be configured as $M=2^{(6/2)}=8$ possible combinations, whereas all possible combinations of the 6 constituent resistors 1508 is $6!/((3!)(3!))=20$. Although particular values of N and M have been described, the embodiments are not limited to those values, and advantageously N and M may take on other values in other embodiments as needed to satisfy the required level of resistance matching and area restraint and their associated tradeoff.

Figure 17:
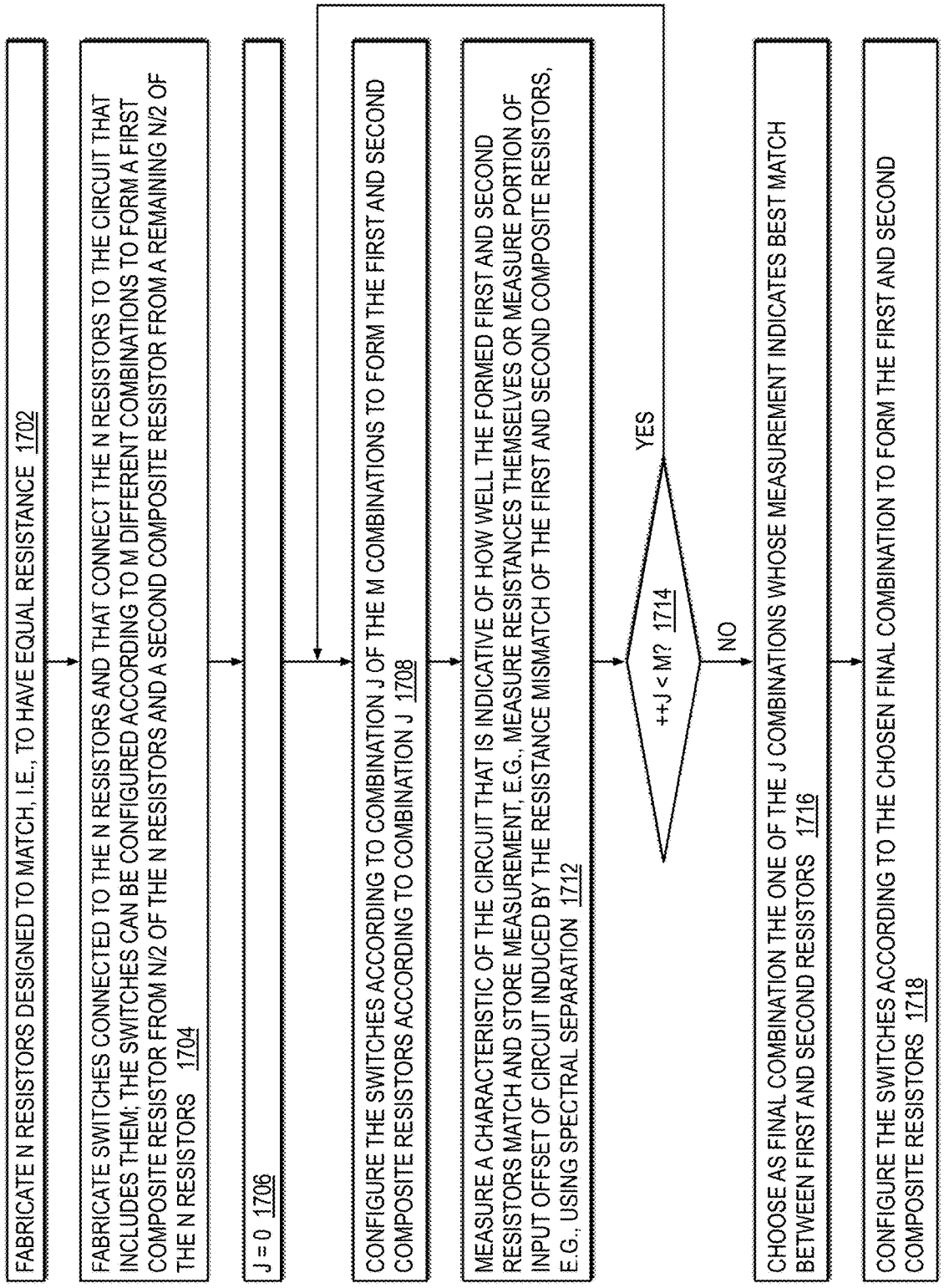
FIG. 17 is an example flowchart illustrating a method of resistance matching of a composite resistor pair in accordance with embodiments of the present disclosure.

FIG. 17 is an example flowchart illustrating a method of resistance matching of a composite resistor pair in accordance with embodiments of the present disclosure. Operations begins at block 1702.

At block 1702, N resistors are fabricated that are designed to match, i.e., to have equal resistance, e.g., 100 Ohms. Referring to the example of FIG. 15, N is 8, i.e., 8 constituent resistors 1508 are fabricated. Operation proceeds to block 1704.

At block 1704, switches (e.g., switches 1502 of FIG. 15) are fabricated that are connected to the N resistors and that connect the N resistors to the circuit that includes the composite resistors that will be formed from the N resistors. The switches are configurable according to M different combinations to form the pair of composite resistors, e.g., Rcp and Rcm of FIG. 15. That is, a given combination configures the switches to connect N/2 of the constituent resistors 1508 specified by the combination to form the first composite resistor, and the combination configures the switches to connect the remaining N/2 of the constituent resistors 1508 to form the second composite resistor. Operation proceeds to block 1706.

At block 1706, a loop variable, denoted J in FIG. 17, is set to an initial value, e.g., zero. The loop variable specifies one of the M combinations according to which the switches may be configured to form the pair of composite resistors. Operation proceeds to block 1708.

At block 1708, the switches are configured to form the composite resistors according the current combination of the M combinations specified by the loop variable. The composite resistors may be formed by the switches by connecting the constituent resistors in parallel (e.g., as described with respect to FIGS. 15, 16 and 19) or in series (e.g., as described with respect to FIGS. 22 through 24). Operation proceeds to block 1712.

At block 1712, a characteristic of the circuit is measured that indicates how well the composite resistors formed at block 1708 match. The measurement is then stored for later analysis and use, e.g., at blocks 1716 and 1718. In one embodiment, the measured characteristic may be the resistances themselves of the composite resistors such that the mismatch may be determined directly, i.e., by comparing the measured resistances, e.g., by ratio or difference. However, in other embodiments the measured characteristic may be a more indirect indication of the mismatch. For example, in one embodiment a spectral separation method described above (and described in more detail below with respect to FIG. 18) may be used to determine the characteristic, which may be a portion of an input offset of the circuit attributable to the resistance mismatch of the composite resistors. The measured portion of the offset may then be stored and compared with other stored measured offset portions, e.g., by ratio or difference. Operation proceeds to block 1714.

At block 1714, the loop variable is incremented and then compared with M. If the value of the loop variable is less than M indicating more combinations remain to be tried, operation returns to block 1708; otherwise, operation proceeds to block 1716.

At block 1716, the combination of the M combinations whose stored measurement indicates the best match between the composite resistors is chosen as the final combination. Generally speaking, the combination with the best match is the combination whose measured characteristic value is a maximum or minimum, depending upon the measured characteristic. For example, if the measured characteristic is the difference between the two resistances of the first and second composite resistors, then the combination with the minimum value is the best match. To illustrate by example, assume 16 different combinations were measured and yielded resistance mismatches of 0.3, 0.2, 0.1, 0.4, 0.2, 0.5, 0.6, 0.3, 0.1, 0.2, 0.4, 0.3, 0.3, 0.4, 0.2 and 0.1 Ohms. In such a sample, one of the combinations that has a resistance mismatch of 0.1 Ohms is chosen as the final combination. For another example, if the measured characteristic is the portion of the input offset induced by mismatch of the first and second composite resistors (e.g., measured using spectral separation by an ADC), then the combination with the minimum value is the best match. To illustrate by example, assume only the composite resistor pair is chopped (e.g., as described with respect to FIG. 20C among others) at a chopping frequency such that the energy measured on the output of the circuit (e.g., by the ADC) based on the chopping frequency is the measured characteristic, i.e., the portion of the input offset attributable to resistor mismatch of the composite resistor pair is measured via spectral separation. In such an embodiment, the combination with the minimum energy measured based on the chopping frequency is chosen as the final combination. However, other measured characteristics may be employed in which the combination with the maximum value is the best match. Furthermore, the measured characteristic need only be a relative value from which the minimum/maximum may be determined, i.e., the measured characteristic need not be the direct measurement of the resistances of the composite resistors in Ohms, rather the measured characteristic of a combination need only be comparable against the measured characteristic of the other combinations. In other embodiments, an acceptable value of the measured characteristic is known (e.g., a digital voltage that indicates the portion of the input offset induced by the resistance mismatch of the composite resistor pair), and the combination with the best match may be defined as the first combination of the M combinations whose measured characteristic meets the acceptable value. For example, an additional check may be made at decision block 1714 of FIG. 17, and the loop iteration may stop, and operation may proceed to block 1716 if the measured characteristic meets the acceptable value. Such an embodiment may be advantageous in reducing the average calibration time required to determine the final combination. Operation proceeds to block 1718.

At block 1718, the switches are configured according to the final combination chosen at block 1716 to form the composite resistors for subsequent use, e.g., in a mission mode of the circuit that includes the composite resistors formed by the final combination.

Operations similar to those described with respect to FIG. 17 may be performed to match other types of composite circuit elements, e.g., composite transistors, composite current sources, composite capacitors, such as illustrated below with respect to FIGS. 25 through 27.

FIG. 18 is an example flowchart illustrating a method of performing block 1712 of FIG. 17 in accordance with embodiments of the present disclosure. Operation begins at block 1802.

At block 1802, spectral separation is used to separate the error induced by mismatch of the resistances of the composite resistor pair formed at block 1708 of FIG. 17 from error induced by mismatch of other pairs of elements of the circuit. For example, the spectral separation may be accomplished by chopping the composite resistors formed at block 1708 (e.g., as described below with respect to FIGS. 20A-20C) and not chopping the other pairs of elements, e.g., similar to the manner described above with respect to FIGS. 2-5. For another example, the spectral separation may be accomplished by not chopping the composite resistors formed at block 1708 and chopping the other pairs of elements, e.g., similar to the manner described above with respect to FIGS. 6-9. For another example, the spectral separation may be accomplished by chopping the composite resistors formed at block 1708 at a first chopping frequency and chopping the other pairs of elements at chopping frequencies different from the first chopping frequency, e.g., similar to the manner described above with respect to FIGS. 10-12. Furthermore, the method described with respect to FIG. 13 may also be employed to further increase the accuracy of the mismatch indication characteristic measurement. Operation proceeds to block 1804.

At block 1804, the portion of the input offset attributable to the mismatch of the composite resistor pair is measured, e.g., by an ADC at the output of the circuit. The portion of the input offset may be measured around the chopping frequency (e.g., similar to the manner described above with respect to FIGS. 2-5), around DC (e.g., similar to the manner described above with respect to FIGS. 6-9), or around the first chopping frequency (e.g., similar to the manner described above with respect to FIGS. 10-12), corresponding to the respective spectral separation methods described with respect to block 1802.

Operations similar to those described with respect to FIG. 18 may be performed to match other types of composite circuit elements, e.g., composite transistors, composite current sources, composite capacitors, such as illustrated below with respect to FIGS. 25 through 27.

FIG. 19 is an example flowchart illustrating a method of performing blocks 1702 and 1704 of FIG. 17 in accordance with embodiments of the present disclosure. Operation is performed at block 1902.

At block 1902, each of the N resistors is designed to have a resistance equal to (N/2)*R, where R is the target resistance of each of the composite resistors (which is also referred to as Q with respect to FIG. 15). Additionally, the switches are designed such that they can be configured to connect each set of the N/2 constituent resistors in parallel to form the composite resistors. (Embodiments are described below with respect to FIGS. 22-24 in which the switches are designed such that they can be configured to connect each set of the N/2 constituent resistors in series rather than in parallel.)

Figure 20A:
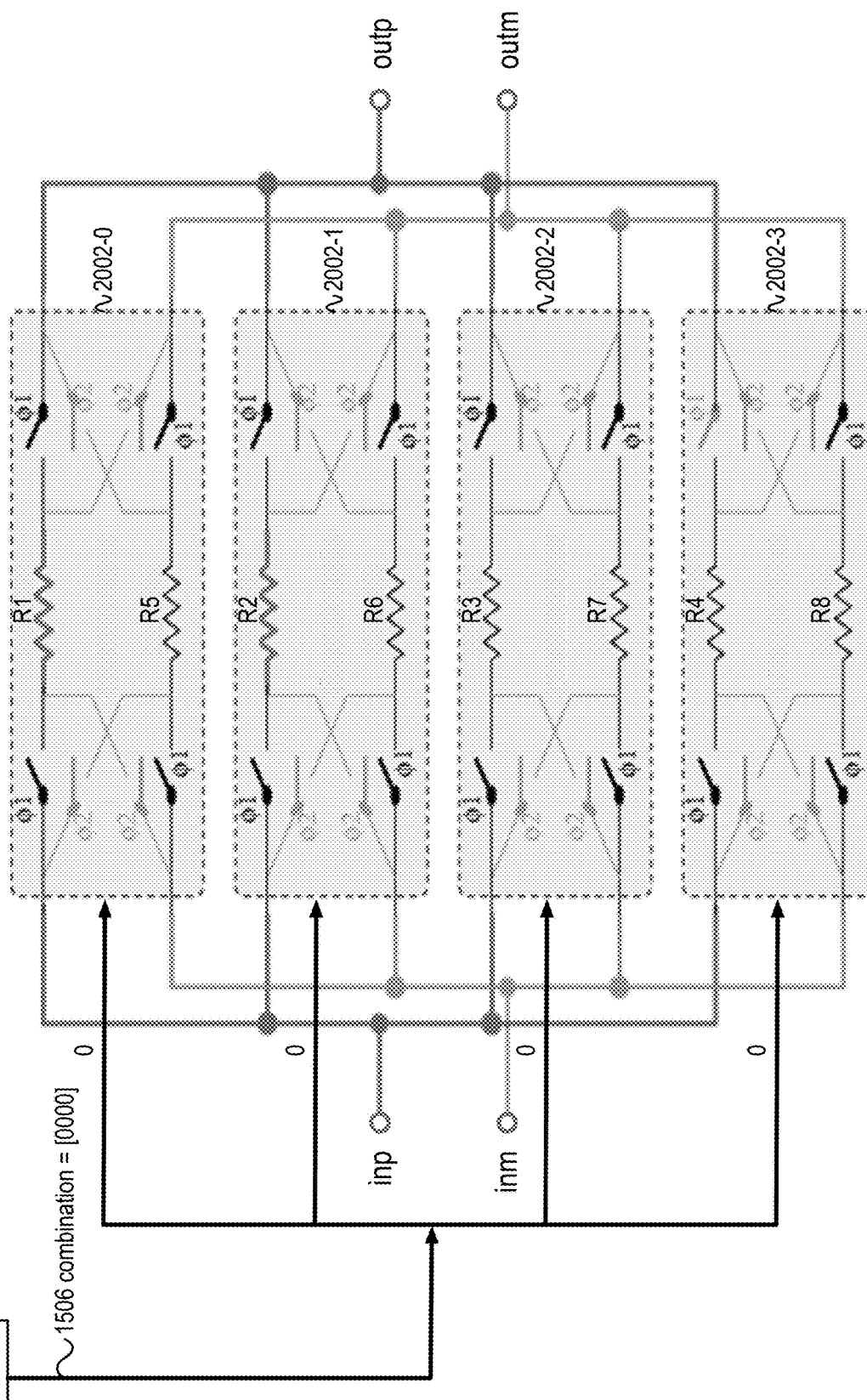
FIGS. 20A and 20B are example circuit diagrams illustrating formation of a pair of composite resistors in accordance with embodiments of the present disclosure.

FIG. 20A is an example circuit diagram illustrating formation of a pair of composite resistors in accordance with embodiments of the present disclosure. In the embodiment of FIG. 20A, N=8, as in FIG. 15, and the switches (switch network 1502 of FIG. 15) are fabricated such that M=2^(8/2)=16. The constituent resistors are shown as R1-R8 as in FIG. 15. In FIG. 20A, four boxes denoted 2002-0, 2002-1, 2002-2 and 2002-3 are shown each including a constituent resistor pair and switches. The switches are configurable to connect the respective input terminals of the constituent resistor pair to alternate composite resistor input terminals inp and inm and configurable to connect the respective output terminals of the constituent resistor pair to corresponding alternate composite resistor output terminals outp and outm, as shown. The combination signal 1506 provided by controller 1504 is shown in FIG. 20A as a 4-bit control value. Each box 2002 receives a respective control bit of the 4-bit combination signal 1506 that controls, for each constituent resistor of the pair, which pair of input/output terminals—inp/outp or inm/outm—the switches will connect to the constituent resistor. In the example of FIG. 20A, box 2002-0 includes constituent resistor pair R1 and R5, box 2002-1 includes constituent resistor pair R2 and R6, box 2002-2 includes constituent resistor pair R3 and R7, and box 2002-3 includes constituent resistor pair R4 and R8.

Within each box 2002, each switch is labeled with either φ1 or φ2 as shown. A switch labeled φ1 indicates the switch is closed when φ1 is true and otherwise is open; conversely, a switch labeled φ2 indicates the switch is closed when φ2 is true and otherwise is open. More detail about an example embodiment of the boxes and the generation and operation of signals φ1 and φ2 are described below with respect to FIG. 20C, which provides the capability to chop the composite resistors, e.g., in order to perform spectral separation of error induced by the composite resistors from other error in the including circuit. For ease of illustration with respect to FIGS. 20A and 20B, assume that if the control bit of the combination 2206 is zero (0) then the top constituent resistor will be connected to the positive terminals inp/outp when φ1 is true and the bottom constituent resistor will be connected to the negative terminals inm/outm when φ1 is true, and if the control bit is one (1) then the top constituent resistor will be connected to the negative terminals inm/outm when φ1 is true and the bottom constituent resistor will be connected to the positive terminals inp/outp when φ1 is true. In other words, the control bit provides the ability to swap, or crossover, the positions of the two constituent resistors within a box with respect to whether they are whether they are part of the positive composite resistor Rcp or part of the negative composite resistor Rcm, e.g., in the positive differential path or the negative differential path. Furthermore, for a given value of the control bit, when φ2 is true, the positions of the two constituent resistors within a box are swapped, or crossed over, with respect to their positions when φ1 is true. The control bit is referred to as the crossover signal in FIG. 20C.

In the example of FIG. 20A, the combination signal 1506 value is [0000]. Therefore, when φ1 is true, the positive composite resistor Rcp is the parallel connection of constituent resistors R1 through R4, and the negative composite resistor Rcm is the parallel connection of constituent resistors R5 through R8, as shown. Conversely, when φ2 is true, the positive composite resistor Rcp is the parallel connection of constituent resistors R5 through R8, and the negative composite resistor Rcm is the parallel connection of constituent resistors R1 through R4, as shown.

Figure 20B:
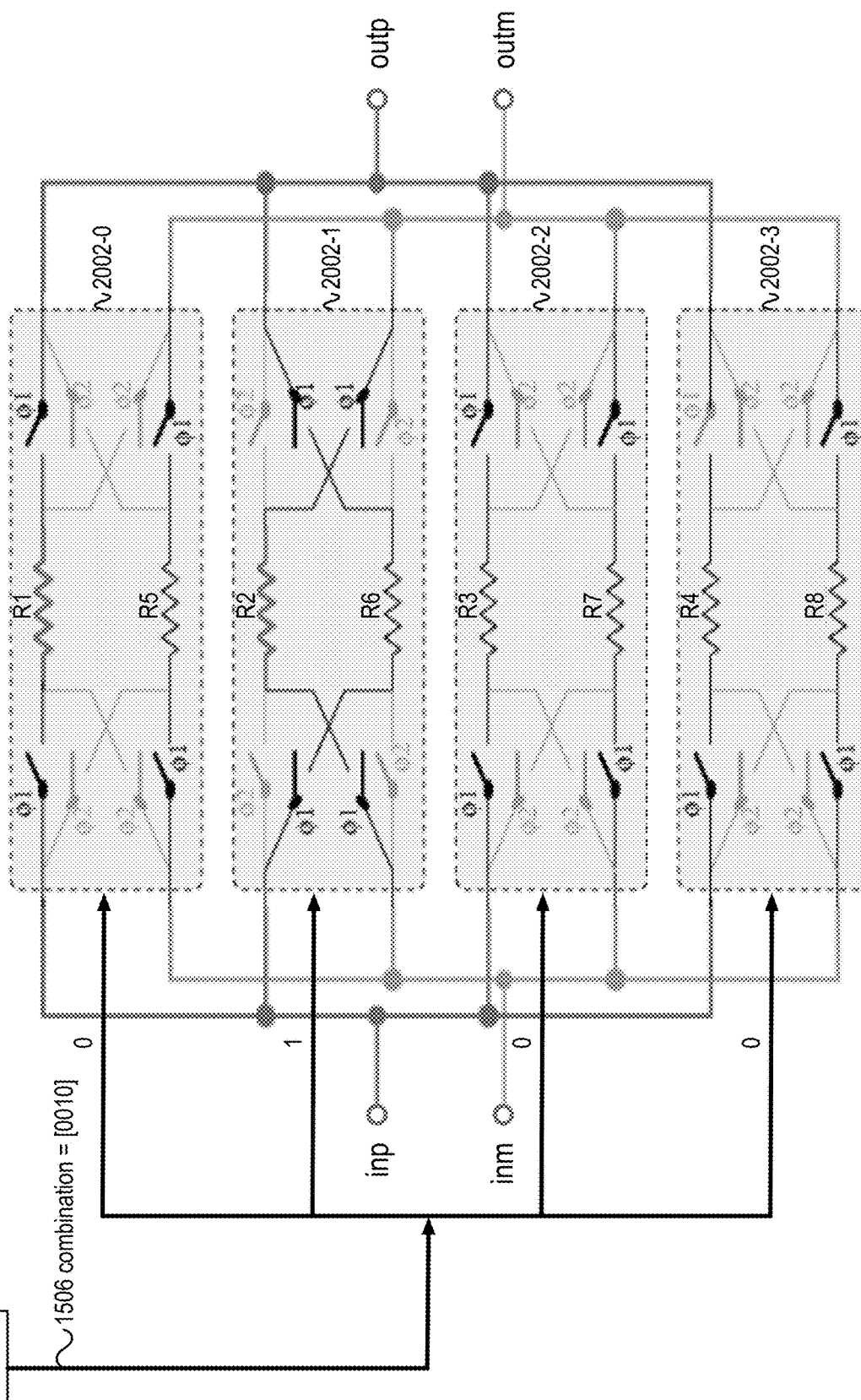

In the example of FIG. 20B, the combination signal 1506 value is [0010]. Therefore, when φ1 is true, the positive composite resistor Rcp is the parallel connection of constituent resistors R1, R6, R3 and R4, and the negative composite resistor Rcm is the parallel connection of constituent resistors R5, R2, R7 and R8, as shown. Conversely, when φ2 is true, the positive composite resistor Rcp is the parallel connection of constituent resistors R5, R2, R7 and R8, and the negative composite resistor Rcm is the parallel connection of constituent resistors R1, R6, R3 and R4, as shown. That is, the position of constituent resistors R2 and R6 within the composite resistors Rcp and Rcm is swapped, or crossed over, in the combination of FIG. 20B relative to the combination of FIG. 20A.

To illustrate by example a benefit of the swapping, or crossover, capability, assume in a given fabrication instance of the integrated circuit that each of constituent resistors R3 through R8 have a resistance that is a target value, e.g., 400 Ohms, and assume constituent resistors R1 and R2 have a resistance that is 2% larger than the target value, e.g., 408 Ohms. In this case, when φ1 is true, the combination 1506=[0000] of FIG. 20A yields a resistance of positive composite resistor Rcp of 101 Ohms and a resistance of negative composite resistor Rcm of 100 Ohms. In contrast, the combination 1506=[0010] of FIG. 20B yields a resistance of positive composite resistor Rcp of 100.5 Ohms and a resistance of negative composite resistor Rcm of 100.5 Ohms. Thus, the resistance mismatch of the composite resistor pair formed by combination [0000] of FIG. 20A is 1%, whereas the resistance mismatch of combination 1506=[0000] of FIG. 20B is zero.

Figure 20C:
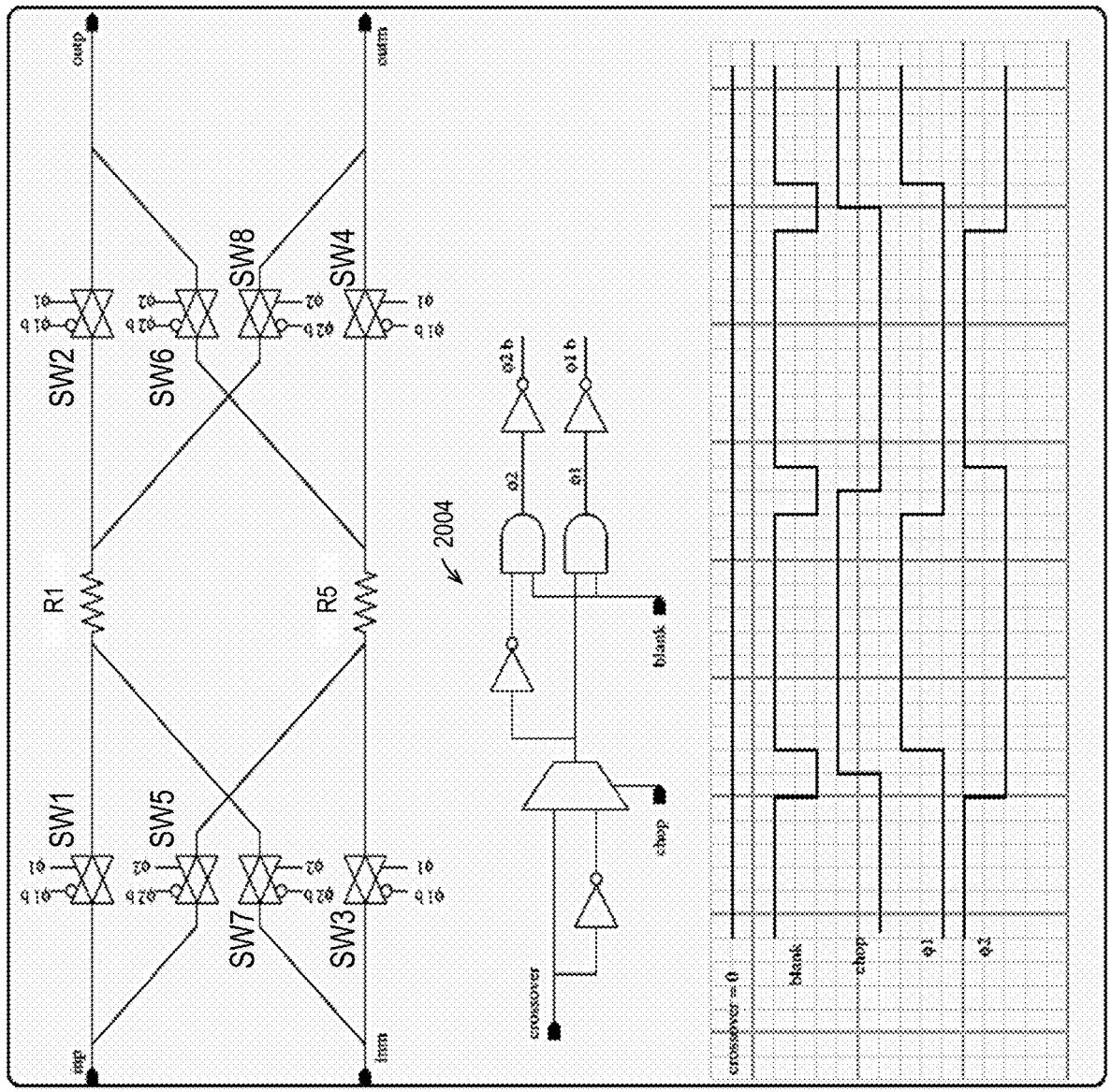
FIG. 20C is an example circuit diagram illustrating in more detail an embodiment of a box of FIG. 20A in accordance with embodiments of the present disclosure.

FIG. 20C is an example circuit diagram illustrating in more detail an embodiment of box 2002-0 of FIG. 20A in accordance with embodiments of the present disclosure. Although an embodiment of box 2002-0 of FIG. 20A is shown, i.e., the box 2002 that receives control bit 0 of the combination 1506, each of the boxes 2002 of FIGS. 20A and 20B may be fabricated similarly. Eight switches labeled SW1 through SW8 are included. Switches SW1 through SW4 receive signals φ1 and φ1b (i.e., φ1 bar, which is the inverse of φ1). Switches SW5 through SW8 receive signals φ2 and φ2b (i.e., φ2 bar, which is the inverse of φ2). When φ1 is true and φ1b is false, switches SW1 through SW4 are closed, and when φ2 is true and φ2b is false, switches SW5 through SW8 are closed. SW1 is connected between inp and the input terminal of R1; SW2 is connected between outp and the output terminal of R1; SW3 is connected between inm and the input terminal of R5; SW4 is connected between outm and the output terminal of R5; SW5 is connected between inp and the input terminal of R5; SW6 is connected between outp and the output terminal of R5; SW7 is connected between inm and the input terminal of R1; and SW8 is connected between outm and the output terminal of R1.

The generation of φ1, φ1b, φ2 and φ2b may be performed by a circuit 2004 shown in the bottom portion of FIG. 20C according to the signal timing diagram shown below the circuit 2004. The circuit 2004 includes a 2-input multiplexer that receives a crossover signal and the inverse of the crossover signal. The crossover signal, as described above, may be control bit 0 of the combination 1506 of FIG. 20A. In the example timing diagram shown, the crossover signal is zero. A chop signal controls which input the multiplexer selects. The chop signal may be a clock signal (as shown in the timing diagram) that operates at a chopping frequency. A first 2-input AND gate that generates φ1 receives the output of the multiplexer and a blank signal. A second 2-input AND gate that generates φ2 receives the inverse of the output of the multiplexer and the blank signal. Finally, a pair of inverters generate φ1b and φ2b. As shown in the timing diagram, the blank signal is low just around each rising and falling edge of the chop clock signal. The resulting φ1 and φ2 signals are true at mutually exclusive periods and in a non-overlapping manner, as shown in the timing diagram FIG. 20C. When chopping is not part of operation of the composite resistors, then the values of the chop and blank signals will be static and the crossover signal will be static at its final configuration value; therefore, the φ1, φ2, φ1b and φ2b signals will also be static so that chopping is not performed. For example, chopping may not be part of the operation once the final combination has been chosen and the switches are configured with the chosen final combination and chopping is not employed in mission mode. For another example, chopping may not be part of the operation in an embodiment in which the composite resistors do not need to be chopped to measure the characteristic, e.g., the resistances are directly measured, or the embodiment of spectral separation is used in which the composite resistors are not chopped. Blanking may be advantageous in certain situations but may not be necessary in others. If blanking is not necessary, the blanking signal may be tied high. Alternately logic 2004 may be modified to eliminate the blanking function.

Although different switch networks are described that enable different combinations of the constituent resistors (e.g., $2^{(N/2)}$ combinations or N! combinations), other embodiments are contemplated that enable different numbers of combinations of the constituent resistors. Generally speaking, the larger number of different combinations of the constituent resistors that may be connected to form the composite resistor pair for a given number of constituent resistors, the greater the statistical reduction in standard deviation of resistance mismatch that may be achieved in a significantly large sample. Furthermore, although different numbers of constituent resistors are described from which to form the composite resistor pair, other embodiments are contemplated that include different numbers of constituent resistors. Generally speaking, the larger the number of constituent resistors from which to form the composite resistor pair, the greater the statistical reduction in standard deviation of resistance mismatch that may be achieved in a significantly large sample. Stated alternatively, conventionally the circuit designer pays for better matching in the currency of area, i.e., paying an increased area yields better matching. In contrast, the described embodiments enable the designer to pay for better matching in the currency of time. That is, by paying an increased calibration time—required to measure the increased number of possible combinations afforded by a larger number of constituent resistors and/or a more complex switch network—yields better matching.

However, simulations have indicated a significant matching improvement with an embodiment having a modest number of constituent resistors and modestly complex switch network. Taking the embodiment of FIGS. 20A-20C, the simulation randomly generates constituent resistors according to foundry resistance mismatch specifications (e.g., standard deviation for different resistor sizes) to essentially simulate the operation of blocks 1702 and 1704 of FIG. 17. The simulation then effectively performs the operations of blocks 1706 through 1718 of FIG. 17. The simulation performs the steps one million times to create a large sample size. Assuming the same area allocation, a characterization of the statistical improvement for the given sample size is that a ratio of the standard deviation of the resistance mismatch for a conventional resistor pair and the standard deviation of the resistance mismatch for the composite resistors is over 4.6. Furthermore, to accomplish the 4.6 improvement in standard deviation of the resistance mismatch, the conventional resistor pair would need to be made over 21 times larger in area. An alternate way to characterize reduced complexity embodiments such as the embodiment of FIGS. 20A-20C is that, although perhaps not providing the best possible performance (e.g., N! combinations with a larger number of constituent resistors), reduced complexity embodiments may provide significantly improved performance over conventional methods. In summary, the embodiments described herein may be employed to either improve matching, reduce area or a combination thereof, in exchange for an increase in calibration time.

In an alternate embodiment, along with the N constituent resistors, D additional constituent resistors may be fabricated that are designed to have the same resistance as each of the N constituent resistors. Furthermore, the switch network may be enhanced to be configurable to form the two mutually exclusive sets of N/2 constituent resistors of the N+D constituent resistors into the constituent resistor pair according to E additional combinations along with the M combinations. Each of the M+E combinations are configured and measured, and the final combination is chosen from the M+E combinations. It may be beneficial to exclude some constituent resistors from the final combination, e.g., if their deviation from the target constituent resistor resistance is particularly large such that including them would result in composite resistor resistances that, although well-matched, might still deviate unacceptably from the target resistance of the composite resistors.

FIG. 21 is an example flowchart illustrating a method of chopping dynamically configurable composite resistors operating in mission mode in accordance with embodiments of the present disclosure. Operation is performed at block 2102.

At block 2102, while the circuit that includes the pair of composite resistors formed by the chosen final combination (e.g., 1506/2206 of FIG. 15/22) of constituent resistors (e.g., Rcp and Rcm of FIG. 15/22) is operating in mission mode, the switch networks (e.g., 1502/2202 of FIG. 15/22) are used to chop the pair of composite resistors. That is, the final combination has an inverse configuration in which the set of N/2 constituent resistors that form the first composite resistor (e.g., Rcp) according to the final combination instead form the second composite resistor (e.g., Rcm) according to the inverse configuration, and the set of N/2 constituent resistors that form the second composite resistor according to the final combination instead form the first composite resistor according to the inverse configuration. The switch network is used to chop the pair of composite resistors by alternating the configuration (e.g., 1506/2206 by controller 1504/2204) at a chopping frequency between the final combination and the inverse configuration. Additionally, de-chopping switches are included in the circuit to de-chop the processed signal (e.g., the amplified signal in the case of a differential amplifier or gain stage) in order to bring the processed signal back into the original frequency band. Such an embodiment may be useful to further mitigate the effect of any residual mismatch between the formed pair of composite resistors remaining in the final combination, e.g., in the presence of ball stress-induced mismatch, particularly in a circuit application in which a chopping frequency may be found such that there is not a prohibitive amount of input signal energy outside the frequency band of interest that would undesirably get folded back into the output within the frequency band of interest.

FIG. 22 is an example circuit diagram illustrating a pair of composite resistors Rcp and Rcm in accordance with an alternate embodiment of the present disclosure. Similar to the embodiment of FIG. 15, the composite resistors Rcp and Rcm have respective input terminals inp and inm and have respective output terminals outp and outm for connection within a circuit. Each composite resistor of the pair of composite resistors Rcp and Rcm is designed to have an equivalent matching resistance value generally referred to as Q ohms, for illustration by comparison with the pair of resistors Rp and Rm of FIG. 14. The composite resistor pair Rcp and Rcm is designed to be configurable to have matching resistances for use within the circuit.

For use in forming the composite resistors Rcp and Rcm, a set of N constituent resistors 2208, each designed to have the same resistance Q/(N/2) (i.e., Q divided by one-half N) is fabricated on the integrated circuit. In the example of FIG. 22, N is 8, and each constituent resistor 2208 is designed to have a resistance value of Q/4 ohms for forming composite resistors Rcp and Rcm each having an equivalent resistance of Q ohms. In FIG. 22, the 8 constituent resistors are referred to as R1, R2, R3, R4, R5, R6, R7 and R8. In the example of FIG. 22, each of the constituent resistors 2208 has a length of L/4 and a width of W, which is useful to illustrate that the N constituent resistors 2208 may occupy approximately the same area as two conventional resistors as shown in FIG. 14 and yet provide improved matching, as described in more detail below. However, other embodiments are contemplated in which the constituent resistors 2208 are shaped differently than shown (i.e., that have dimensions different than L×W/N) and yet have a resistance of Q/(N/2).

A first switch network 2202i is fabricated to connect the input terminals inp and inm to the input terminal of each of constituent resistors 2208 R1 and R2. A second switch network 2202-1 is fabricated to connect the output terminals of constituent resistors 2208 R1 and R2 to the input terminals of constituent resistors 2208 R3 and R4. A third switch network 2202-2 is fabricated to connect the output terminals of constituent resistors 2208 R3 and R4 to the input terminals of constituent resistors 2208 R5 and R6. A fourth switch network 2202-3 is fabricated to connect the output terminals of constituent resistors 2208 R5 and R6 to the input terminals of constituent resistors 2208 R7 and R8. A fifth switch network 2202o is fabricated to connect the output terminals of constituent resistors 2208 R7 and R8 to the output terminals outp and outm. The switch networks are referred to collectively as switch networks 2202 and individually generically as a switch network 2202. Each of the switch networks 2202 is configurable either in a pass-through configuration to connect the left upper input to the left lower input and the right upper input to the right lower input or in a crossover configuration to connect the left upper input to the right lower input and the right upper input to the left lower input. Like switch networks 1502 of FIG. 15, the individual switches of the switch networks 2202 may be transistors, such as MOSFET transistors, that may be fabricated on the integrated circuit within a very small area relative to the area within which the set of N constituent resistors 2208 are fabricated such that in FIG. 22 the size of the switch networks 2202 is not drawn to scale relative to the size of the constituent resistors 2208.

The switch networks 2202 are dynamically configurable by a controller 2204 that provides a combination signal 2206 to the switch networks 2202 that specifies how the switch networks 2202 are configured to connect which of the constituent resistors 2208 to each other and to which of the input/output pairs inp/outp and inm/outm to form the composite resistors Rcp and Rcm, examples of which are shown in FIGS. 24A-24D and described below. That is, the combination 2206 is a control signal to the switches 2202 that determines which of the N/2 constituent resistors 2208 are connected in series and to the inp and outp terminals and which of the remaining N/2 constituent resistors 2208 are connected in series and to the inm and outm terminals. That is, each of the composite resistors Rcp and Rcm is formed by mutually exclusive sets of N/2 of the N constituent resistors 2208 that is specified by the combination 2206. The controller 2204 may be operated similar to the manner described above with respect to FIG. 15.

FIGS. 24A through 24D illustrate four different example combinations 2206 of the constituent resistors 2208 via the switch networks 2202 of FIG. 22. In FIGS. 24A through 24D, composite resistor Rcp includes the shaded constituent resistors 2208, and composite resistor Rcm includes the non-shaded constituent resistors 2208. In the combination 2206 of FIG. 24A, constituent resistors R1, R3, R5 and R7 are connected in series by the switch networks 2202 to form composite resistor Rcp and constituent resistors R2, R4, R6 and R8 are connected in series by the switch networks 2202 to form composite resistor Rcm. In the combination 2206 of FIG. 24B, constituent resistors R1, R4, R5 and R8 are connected in series by the switch networks 2202 to form composite resistor Rcp and constituent resistors R2, R3, R6 and R7 are connected in series by the switch networks 2202 to form composite resistor Rcm. In the combination 2206 of FIG. 24C, constituent resistors R2, R3, R6 and R7 are connected in series by the switch networks 2202 to form composite resistor Rcp and constituent resistors R1, R4, R5 and R8 are connected in series by the switch networks 2202 to form composite resistor Rcm. In the combination 2206 of FIG. 24D, constituent resistors R1, R3, R5 and R8 are connected in series by the switch networks 2202 to form composite resistor Rcp and constituent resistors R2, R4, R6 and R7 are connected in series by the switch networks 2202 to form composite resistor Rcm.

As may be observed, the combinations 2206 of FIGS. 24B and 24C are inverses of one another. Stated alternatively, the input/output pairs inp/outp and inm/outm to which the two different mutually exclusive sets of constituent resistors 2208 are connected by the switch networks 2202 are swapped between the combination 2206 of FIG. 24B and the combination 2206 of FIG. 24C. In other words, the composite resistors Rcp and Rcm are swapped between the combinations 2206 of FIGS. 24B and 24C, which may be useful for chopping the composite resistors Rcp and Rcm, e.g., to perform spectral separation and/or as a supplement to composite resistor Rcp and Rcm matching, as described in more detail below. It may be observed that the combinations 2206 of FIGS. 2A through 24D may conform to a limited set of combinations 2206 that may be imposed by the switch networks 2202. More specifically, in the embodiment of FIG. 22, the switch networks 2202 are fabricated such that each constituent resistor 2208 has a corresponding constituent resistor 2208 that forms a constituent resistor pair (i.e., constituent resistors R1 and R2 for a constituent resistor pair, constituent resistors R3 and R4 for a constituent resistor pair, constituent resistors R5 and R6 for a constituent resistor pair, and constituent resistors R7 and R8 for a constituent resistor pair), and for each constituent resistor pair, one resistor must be part of formed composite resistor Rcp and the other resistor must be part of formed composite resistor Rcm. In such an embodiment of the switch networks 2202, the number of possible combinations M=2^(N/2) (i.e., 2 to the power one-half N), and which is 16 in the example embodiment of FIG. 22 in which N=8. This is in contrast to an embodiment of the switch networks 2202 that may be configured in all possible combinations of the N constituent resistors 2208, which is M=N! (i.e., N factorial), and which is 40,320 in an example embodiment of in which N=8. In such an embodiment, the switch network is fabricated such that each constituent resistor 2208 may be connected to each other constituent resistor 2208 and to each of the input terminals inp and inm and output terminals outp and outm. To illustrate by another example in which N is 6, the limited set of combinations embodiment described above may be configured as M=2^(6/2)=8 possible combinations, whereas all possible combinations of the 6 constituent resistors 2208 is 6!=720. Although particular values of N and M have been described, the embodiments are not limited to those values, and advantageously N and M may take on other values in other embodiments as needed to satisfy the required level of matching and area restraint.

FIG. 23 is an example flowchart illustrating a method of performing blocks 1702 and 1704 of FIG. 17 in accordance with embodiments of the present disclosure. Operation is performed at block 2302.

At block 2302, each of the N resistors is designed to have a resistance equal to R/(N/2), where R is the target resistance of each of the composite resistors (which is also referred to as Q with respect to FIG. 15). Additionally, the switches are designed such that they can be configured to connect each set of the N/2 constituent resistors in series to form the composite resistors.

FIG. 25 is an example circuit diagram illustrating a pair of composite transistors Mcp and Mcm in accordance with embodiments of the present disclosure. The composite transistors Mcp and Mcm have respective input terminals inp and inm and have respective output terminals outp and outm and have respective third terminals t3p and t3m for connection within a circuit. In some embodiments, the third terminals may be connected to a voltage rail. Each composite transistor of the pair of composite transistors Mcp and Mcm is designed to have matching relevant characteristics, such as transconductance (gm), threshold voltage (Vt), or other parameters. The composite transistor pair Mcp and Mcm is designed to be configurable to have matching relevant characteristics for use within the circuit. For example, the composite transistors Mcp and Mcm may be used on associated positive and negative nodes of a differential circuit.

For use in forming the composite transistors Mcp and Mcm, a set of N transistors 2508, referred to as constituent transistors 2508, each designed to have the same relevant characteristics (e.g., transconductance and threshold voltage) is fabricated on the integrated circuit. In the example of FIG. 25, N is 8, and each constituent transistor 2508 is designed to have matching relevant characteristics, e.g., transconductance or threshold voltage. In FIG. 25, the 8 constituent transistors are referred to as M1, M2, M3, M4, M5, M6, M7 and M8. In the example of FIG. 25, each of the constituent transistors 2508 has a geometry such that the N constituent transistors 2508 may occupy approximately the same area as two conventional transistors and yet provide improved matching.

A first switch network 1502i is fabricated to connect to the input terminal of each of the N constituent transistors 2508, and a second switch network 1502o is fabricated to connect to the output terminal of each of the N constituent transistors 2508. The input switch network 1502i has the input terminals inp and inm, and the output switch network 1502*o* has the respective output terminals outp and outm. The switch networks 1502 may be similar to those of FIG. 15. In particular, the switch networks 1502 are dynamically configurable by the controller 1504 that provides the combination signal 1506 that specifies how the switch networks 1502 are configured to connect which of the constituent transistors 2508 to which of the input/output pairs inp/outp and inm/outm to form the composite transistors Mcp and Mcm. Each of the composite transistors Mcp and Mcm is formed by mutually exclusive sets of N/2 of the N constituent transistors 2508 that is specified by the combination 1506. In one embodiment, the constituent transistors 2508 are combined in parallel, e.g., similar to the manner described with respect to FIG. 19 and as shown in FIGS. 16A through 16F. In another embodiment, the constituent transistors 2508 are combined in series, e.g., similar to the manner described with respect to FIGS. 22 through 24.

FIG. 26 is an example circuit diagram illustrating a pair of composite current sources CSp and CSm in accordance with embodiments of the present disclosure. The composite current sources CSp and CSm have respective output terminals outp and outm for connection within a circuit. Each composite current source of the pair of composite current sources CSp and CSm is designed to have matching relevant characteristics, such as output current, which may be dependent upon transconductance, threshold voltage, or resistance of a composite resistor included in the composite current source. The composite current source pair CSp and CSm is designed to be configurable to have matching relevant characteristics for use within the circuit. For example, the composite current sources CSp and CSm may be used on associated positive and negative nodes of a differential circuit.

For use in forming the composite current sources CSp and CSm, a set of N current sources 2608, referred to as constituent current sources 2608, each designed to have the same relevant characteristics (e.g., output current) is fabricated on the integrated circuit. Each constituent current source 2608 may comprise one or more transistors and a resistor or may simply be one or more transistors. In the example of FIG. 26, N is 8, and each constituent current source 2608 is designed to have matching relevant characteristics. In FIG. 26, the 8 constituent current sources are referred to as CS1, CS2, CS3, CS4, CS5, CS6, CS7 and CS8. In the example of FIG. 26, each of the constituent current sources 2608 has a geometry such that the N constituent current sources 2608 may occupy approximately the same area as two conventional current sources and yet provide improved matching.

A switch network 1502*o* is fabricated to connect to the output terminal of each of the N constituent current sources 2608. The switch network 1502*o* has the respective output terminals outp and outm. The switch network 1502 may be similar to that of FIG. 15. In particular, the switch network 1502 is dynamically configurable by the controller 1504 that provides the combination signal 1506 that specifies how the switch networks 1502 are configured to connect which of the constituent current sources 2608 to which of the output pairs outp and outm to form the composite current sources CSp and CSm. Each of the composite current sources CSp and CSm is formed by mutually exclusive sets of N/2 of the N constituent current sources 2608 that is specified by the combination 1506. In one embodiment, the constituent current sources 2608 are combined in parallel, e.g., similar to the manner described with respect to FIG. 19 and as shown in FIGS. 16A through 16F. In another embodiment, the constituent current sources 2608 are combined in series, e.g., similar to the manner described with respect to FIGS. 22 through 24.

FIG. 27 is an example circuit diagram illustrating a pair of composite capacitors Ccp and Ccm in accordance with an embodiment of the present disclosure. The composite capacitors Ccp and Ccm have respective input terminals inp and inm and have respective output terminals outp and outm for connection within a circuit. Each composite capacitor of the pair of composite capacitors Ccp and Ccm is designed to have an equivalent matching capacitance value. The composite capacitor pair Ccp and Ccm is designed to be configurable to have matching capacitances for use within the circuit.

For use in forming the composite capacitors Ccp and Ccm, a set of N constituent capacitors 2208, each designed to have the same capacitance C/(N/2) (i.e., C divided by one-half N) is fabricated on the integrated circuit. In the example of FIG. 27, N is 8, and each constituent capacitor 2208 is designed to have a capacitance value of C/4 ohms for forming composite capacitors Ccp and Ccm each having an equivalent capacitance of C ohms. In FIG. 27, the 8 constituent capacitors are referred to as C1, C2, C3, C4, C5, C6, C7 and C8. In the example of FIG. 27, the N constituent capacitors 2208 may provide improved matching.

A first switch network 2202*i* is fabricated to connect the input terminals inp and inm to the input terminal of each of constituent capacitors 2208 C1 and C2. A second switch network 2202-1 is fabricated to connect the output terminals of constituent capacitors 2208 C1 and C2 to the input terminals of constituent capacitors 2208 C3 and C4. A third switch network 2202-2 is fabricated to connect the output terminals of constituent capacitors 2208 C3 and C4 to the input terminals of constituent capacitors 2208 C5 and C6. A fourth switch network 2202-3 is fabricated to connect the output terminals of constituent capacitors 2208 C5 and C6 to the input terminals of constituent capacitors 2208 C7 and C8. A fifth switch network 2202*o* is fabricated to connect the output terminals of constituent capacitors 2208 C7 and C8 to the output terminals outp and outm. Each of the switch networks 2202 is configurable either in a pass-through configuration to connect the left upper input to the left lower input and the right upper input to the right lower input or in a crossover configuration to connect the left upper input to the right lower input and the right upper input to the left lower input.

Similar to those of FIG. 22, the switch networks 2202 are dynamically configurable by a controller 2204 that provides a combination signal 2206 to the switch networks 2202 that specifies how the switch networks 2202 are configured to connect which of the constituent capacitors 2208 to each other and to which of the input/output pairs inp/outp and inm/outm to form the composite capacitors Ccp and Ccm, similar to the examples shown in FIGS. 24A-24D. That is, the combination 2206 is a control signal to the switches 2202 that determines which of the N/2 constituent capacitors 2208 are connected in series and to the inp and outp terminals and which of the remaining N/2 constituent capacitors 2208 are connected in series and to the inm and outm terminals. That is, each of the composite capacitors Ccp and Ccm is formed by mutually exclusive sets of N/2 of the N constituent capacitors 2208 that is specified by the combination 2206. The controller 2204 may be operated similar to the manner described above with respect to FIG. 15. Although FIG. 27 illustrates an embodiment in which the constituent capacitors 2708 are combined in series, e.g., similar to the manner described with respect to FIG. 22, in another embodiment, the constituent capacitors 2708 are combined in parallel, e.g., similar to the manner described with respect to FIGS. 15 through 20. In a parallel embodiment, the N constituent capacitors used to form the two composite capacitors may occupy approximately the same area as two conventional capacitors.

Embodiments of resistor matching described herein may have certain advantages over conventional solutions. For example, as described above, a conventional solution is to simply increase the area of the resistors in order to accomplish a target minimum resistance mismatch. The embodiments described herein may advantageously provide a significant area improvement by mitigating the need to increase the area. For another example, the embodiments may provide an advantage over dynamic element matching (DEM) because although the time average error of the set of DEM resistors may be acceptable, an individual DEM resistor connected to the circuit in a given time slot may significantly deviate from the target resistance, which may cause the circuit to saturate, clip or perform in some other unacceptable manner during significantly deviant time slots. Stated alternatively, although a DEM solution may minimize the mean error, it may experience a very unacceptable root mean square (RMS) error, for example, such that a DEM system may need to be designed for the worst case, which may require significantly more area than the described embodiments. In contrast, because the described embodiments configure and measure all the combinations and then choose and use only the best combination rather than dynamically cycling through all the resistors in time-varying DEM fashion, the embodiments described herein are less likely to periodically suffer the saturation, clipping, or other ill effects of a bad one or more DEM resistor. Stated alternatively, while some of the M combinations measured at calibration time may yield significantly deviant composite resistors, advantageously those combinations will not be chosen as the final combination and will thus never be used by the circuit in mission mode. Additionally, DEM may result in a non-linear system that may undesirably produce new frequency components on the output of the system, whereas the described static embodiments of matched composite resistors are linear and therefore advantageously provide a frequency response which does not produce new frequency components on the output. Advantageously, the static embodiments described provide both linear and time invariant mission mode operation. Still further, the composite resistor embodiments that do not require switching during mission mode may consume less power than a DEM implementation. Finally, embodiments described herein may be used to improve resistance mismatch even when the mismatch is systematic, without requiring an estimate of the systematic mismatch. A systematic mismatch is a consistent skew of some components due to processing effects, mechanical effects, or other effects. For example, assume resistors R1 through R8, and assume R1 and R3 happen to be close to a solder ball that causes mechanical stress on R1 and R3. The mechanical stress on every circuit manufactured could cause R1 and R3 to have resistance that is consistently higher than the rest of the resistors, i.e., R2 and R4 through R8. The consistently higher impedance of R1 and R3 than the rest of the resistors is undesired and is an example of systematic mismatch.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A method for matching a pair of composite circuit elements included in a circuit, comprising:
    fabricating N circuit elements designed to match;
    fabricating switches configurable after fabrication, according to M different combinations, to connect N/2 of the N circuit elements to form a first composite circuit element of the pair and to connect a remaining N/2 of the N circuit elements to form a second composite circuit element of the pair;
    sequentially in time, for each combination of the M combinations:

configuring the switches to form the first and second composite circuit elements according to the combination; and measuring a characteristic of the circuit that includes the formed first and second composite circuit elements, wherein the characteristic is indicative of how well the formed first and second composite circuit elements match;

choosing a final combination of the M combinations whose measured characteristic indicates a best match; and configuring the switches to form the first and second composite circuit elements according to the final combination;

wherein said measuring the characteristic of the circuit comprises:

spectrally separating error induced by mismatch of the first and second composite circuit elements formed by the combination from mismatch-induced error of other pairs of elements of the circuit; and measuring the error induced by mismatch of the first and second composite circuit elements at an output of the circuit.

2. The method of claim 1, wherein said spectrally separating error induced by mismatch of the first and second composite circuit elements formed by the combination from mismatch-induced error of other pairs of elements of the circuit comprises:

using the switches to chop the first and second composite circuit elements and not chopping the other pairs of elements of the circuit.

3. The method of claim 2, wherein said using the switches to chop the first and second composite circuit elements comprises:

alternating between configuring the switches according to the combination and configuring the switches according to an inverse of the combination.

4. The method of claim 1, wherein said spectrally separating error induced by mismatch of the first and second composite circuit elements formed by the combination from mismatch-induced error of other pairs of elements of the circuit comprises:

using the switches to chop the first and second composite circuit elements at a first chopping frequency while the other pairs of elements of the circuit are chopped at different chopping frequencies than the first chopping frequency.

5. The method of claim 1, wherein said measuring the error induced by mismatch of the first and second composite circuit elements at an output of the circuit comprises:

monitoring, by an analog-to-digital converter (ADC), an output of the circuit; and analyzing the monitored output to measure the error induced by mismatch of the first and second composite circuit elements.

6. The method of claim 1, wherein the error induced by mismatch of the first and second composite circuit elements formed by the combination comprises a portion of an input offset of the circuit induced by the mismatch.

7. The method of claim 1, wherein the circuit comprises an amplifier.

8. The method of claim 1, wherein each of the circuit elements is a resistor.

9. The method of claim 1, wherein each of the circuit elements is a transistor.

10. The method of claim 1, wherein each of the circuit elements is a current source.

11. The method of claim 10, wherein the current source comprises one or more transistors or one or more transistors and a resistor.

12. The method of claim 1, wherein each of the circuit elements is a capacitor.

13. The method of claim 1, wherein the M different combinations according to which the switches are configurable is fewer combinations than all possible N! combinations of the N circuit elements.

14. The method of claim 13, wherein M is approximately $2^{(N/2)}$.

15. The method of claim 13, wherein the switches are configurable such that each of the N circuit elements is effectively paired with one other circuit element of the N circuit elements as N/2 effective pairs, wherein for all of the M combinations, for each effective pair of the N/2 effective pairs, the first composite circuit element has one circuit element from the effective pair and the second composite circuit element has the other circuit element from the effective pair.

16. The method of claim 13, wherein M is at least an order of magnitude fewer combinations than all possible $N!/((N/2)!(N/2)!)$ combinations of the N circuit elements.

17. The method of claim 1,
wherein the switches are configurable to connect the N/2 of the N circuit elements in parallel to form the first composite circuit element and to connect the remaining N/2 of the N circuit elements in parallel to form the second composite circuit element.

18. The method of claim 17,
wherein each of the N circuit elements is a resistor designed to have a resistance equal to $(N/2)*R$, wherein R is a target resistance of the first and second composite circuit elements.

19. The method of claim 1,
wherein the switches are configurable to connect the N/2 of the N circuit elements in series to form the first composite circuit element and to connect the remaining N/2 of the N circuit elements in series to form the second composite circuit element.

20. The method of claim 19,
wherein each of the N circuit elements is a resistor designed to have a resistance equal to $R/(N/2)$, wherein R is a target resistance of the first and second composite circuit elements.

21. The method of claim 1, wherein said choosing the final combination of the M combinations whose measured characteristic indicates the best match is performed during a calibration phase that occurs after reset of the circuit and prior to operating the circuit in a mission mode.

22. The method of claim 21, further comprising:
during the mission mode:
using the switches to chop the first and second composite circuit elements formed by the final combination; and
de-chopping an output of the circuit.

23. The method of claim 1, further comprising:
fabricating D circuit elements in addition to the N circuit elements, wherein the D circuit elements are designed to match the N circuit elements;
wherein the switches are configurable after fabrication, according to M+E different combinations, to connect N/2 of the N+D circuit elements to form a first composite circuit element of the pair and to connect a remaining N/2 of the N+D circuit elements to form a second composite circuit element of the pair, wherein E is a positive integer;

wherein said configuring the switches and said measuring the characteristic of the circuit are performed for each combination of the M+E combinations; and wherein said choosing the final combination is of the M+E combinations whose measured characteristic indicates a best match.

24. A circuit in which a pair of composite circuit elements may be configured to match, comprising:

N circuit elements designed to match;

switches configurable after fabrication, according to M different combinations, to connect N/2 of the N circuit elements to form a first composite circuit element of the pair and to connect a remaining N/2 of the N circuit elements to form a second composite circuit element of the pair; and control logic, configured to:
sequentially in time, for each combination of the M combinations:
configure the switches to form the first and second composite circuit elements according to the combination; and
measure a characteristic of the circuit that includes the formed first and second composite circuit elements, wherein the characteristic is indicative of how well the formed first and second composite circuit elements match;
choose a final combination of the M combinations whose measured characteristic indicates a best match; and
configure the switches to form the first and second composite circuit elements according to the final combination;

wherein to measure the characteristic of the circuit, the control logic:
spectrally separates error induced by mismatch of the first and second composite circuit elements formed by the combination from mismatch-induced error of other pairs of elements of the circuit; and
measures the error induced by mismatch of the first and second composite circuit elements at an output of the circuit.

25. The circuit of claim 24, wherein to spectrally separate error induced by mismatch of the first and second composite circuit elements formed by the combination from mismatch-induced error of other pairs of elements of the circuit, the control logic:
uses the switches to chop the first and second composite circuit elements while the other pairs of elements of the circuit are not chopped.

26. The circuit of claim 25, wherein to use the switches to chop the first and second composite circuit elements, the control logic:
alternates between configuring the switches according to the combination and configuring the switches according to an inverse of the combination.

27. The circuit of claim 24, wherein to spectrally separate error induced by mismatch of the first and second composite circuit elements formed by the combination from mismatch-induced error of other pairs of elements of the circuit, the control logic:
uses the switches to chop the first and second composite circuit elements at a first chopping frequency the other pairs of elements of the circuit are chopped at different chopping frequencies than the first chopping frequency.

28. The circuit of claim 24, wherein to measure the error induced by mismatch of the first and second composite circuit elements at an output of the circuit, the control logic:
monitors, by an analog-to-digital converter (ADC), an output of the circuit; and
analyzes the monitored output to measure the error induced by mismatch of the first and second composite circuit elements.

29. The circuit of claim 24, wherein the error induced by mismatch of the first and second composite circuit elements formed by the combination comprises a portion of an input offset of the circuit induced by the mismatch.

30. The circuit of claim 24, wherein the circuit comprises an amplifier.

31. The circuit of claim 24, wherein each of the circuit elements is a resistor.

32. The circuit of claim 24, wherein each of the circuit elements is a transistor.

33. The circuit of claim 24, wherein each of the circuit elements is a current source.

34. The circuit of claim 33, wherein the current source comprises one or more transistors or one or more transistors and a resistor.

35. The circuit of claim 24, wherein each of the circuit elements is a capacitor.

36. The circuit of claim 24, wherein the M different combinations according to which the switches are configurable is fewer combinations than all possible N! combinations of the N circuit elements.

37. The circuit of claim 36, wherein M is approximately $2^{(N/2)}$.

38. The circuit of claim 36, wherein the switches are configurable such that each of the N circuit elements is effectively paired with one other circuit element of the N circuit elements as N/2 effective pairs, wherein for all of the M combinations, for each effective pair of the N/2 effective pairs, the first composite circuit element has one circuit element from the effective pair and the second composite circuit element has the other circuit element from the effective pair.

39. The circuit of claim 36, wherein M is at least an order of magnitude fewer combinations than all possible N!/((N/2)!(N/2)!) combinations of the N circuit elements.

40. The circuit of claim 24,
wherein the switches are configurable to connect the N/2 of the N circuit elements in parallel to form the first composite circuit element and to connect the remaining N/2 of the N circuit elements in parallel to form the second composite circuit element.

41. The circuit of claim 40,
wherein each of the N circuit elements is a resistor designed to have a resistance equal to (N/2)*R, wherein R is a target resistance of the first and second composite circuit elements.

42. The circuit of claim 24,
wherein the switches are configurable to connect the N/2 of the N circuit elements in series to form the first composite circuit element and to connect the remaining N/2 of the N circuit elements in series to form the second composite circuit element.

43. The circuit of claim 42,
wherein each of the N circuit elements is a resistor designed to have a resistance equal to R/(N/2), wherein R is a target resistance of the first and second composite circuit elements.

44. The circuit of claim 24, wherein the control logic chooses the final combination of the M combinations whose measured characteristic indicates the best match during a calibration phase that occurs after reset of the circuit and prior to operating the circuit in a mission mode.

45. The circuit of claim 44,
wherein the control logic is further configured to, during the mission mode, use the switches to chop the first and second composite circuit elements formed by the final combination, while an output of the circuit is de-chopped.

46. The circuit of claim 24, further comprising:
D circuit elements in addition to the N circuit elements, wherein the D circuit elements are designed to match the N circuit elements;
wherein the switches are configurable after fabrication, according to M+E different combinations, to connect N/2 of the N+D circuit elements to form a first composite circuit element of the pair and to connect a remaining N/2 of the N+D circuit elements to form a second composite circuit element of the pair, wherein E is a positive integer;
wherein the control logic configures the switches and measures the characteristic of the circuit for each combination of the M+E combinations; and
wherein the control logic chooses the final combination as a combination of the M+E combinations whose measured characteristic indicates a best match.

47. A method for matching a pair of composite circuit elements included in a circuit, comprising:
fabricating N circuit elements designed to match;
fabricating switches configurable after fabrication, according to M different combinations, to connect N/2 of the N circuit elements to form a first composite circuit element of the pair and to connect a remaining N/2 of the N circuit elements to form a second composite circuit element of the pair;
sequentially in time, for each combination of the M combinations:
configuring the switches to form the first and second composite circuit elements according to the combination; and
measuring a characteristic of the circuit that includes the formed first and second composite circuit elements, wherein the characteristic is indicative of how well the formed first and second composite circuit elements match;
choosing a final combination of the M combinations whose measured characteristic indicates a best match;
configuring the switches to form the first and second composite circuit elements according to the final combination;
wherein said choosing the final combination of the M combinations whose measured characteristic indicates the best match is performed during a calibration phase that occurs after reset of the circuit and prior to operating the circuit in a mission mode; and
during the mission mode:
using the switches to chop the first and second composite circuit elements formed by the final combination; and
de-chopping an output of the circuit.

48. A circuit in which a pair of composite circuit elements may be configured to match, comprising:
N circuit elements designed to match;
switches configurable after fabrication, according to M different combinations, to connect N/2 of the N circuit elements to form a first composite circuit element of the pair and to connect a remaining N/2 of the N circuit elements to form a second composite circuit element of the pair; and
control logic, configured to:
sequentially in time, for each combination of the M combinations:
configure the switches to form the first and second composite circuit elements according to the combination; and
measure a characteristic of the circuit that includes the formed first and second composite circuit elements, wherein the characteristic is indicative of how well the formed first and second composite circuit elements match;
choose a final combination of the M combinations whose measured characteristic indicates a best match; and
configure the switches to form the first and second composite circuit elements according to the final combination;
wherein the control logic chooses the final combination of the M combinations whose measured characteristic indicates the best match during a calibration phase that occurs after reset of the circuit and prior to operating the circuit in a mission mode; and
wherein the control logic is further configured to, during the mission mode, use the switches to chop the first and second composite circuit elements formed by the final combination, while an output of the circuit is de-chopped.

49. A method for matching a pair of composite circuit elements included in a circuit, comprising:
fabricating N circuit elements designed to match;
fabricating switches configurable after fabrication, according to M different combinations, to connect N/2 of the N circuit elements to form a first composite circuit element of the pair and to connect a remaining N/2 of the N circuit elements to form a second composite circuit element of the pair;
sequentially in time, for each combination of the M combinations:
configuring the switches to form the first and second composite circuit elements according to the combination; and
measuring a characteristic of the circuit that includes the formed first and second composite circuit elements, wherein the characteristic is indicative of how well the formed first and second composite circuit elements match;
choosing a final combination of the M combinations whose measured characteristic indicates a best match;
configuring the switches to form the first and second composite circuit elements according to the final combination; and
fabricating D circuit elements in addition to the N circuit elements, wherein the D circuit elements are designed to match the N circuit elements;
wherein the switches are configurable after fabrication, according to M+E different combinations, to connect N/2 of the N+D circuit elements to form a first composite circuit element of the pair and to connect a remaining N/2 of the N+D circuit elements to form a second composite circuit element of the pair, wherein E is a positive integer;
wherein said configuring the switches and said measuring the characteristic of the circuit are performed for each combination of the M+E combinations; and
wherein said choosing the final combination is of the M+E combinations whose measured characteristic indicates a best match.

50. A circuit in which a pair of composite circuit elements may be configured to match, comprising:

N circuit elements designed to match;

switches configurable after fabrication, according to M different combinations, to connect N/2 of the N circuit elements to form a first composite circuit element of the pair and to connect a remaining N/2 of the N circuit elements to form a second composite circuit element of the pair; and control logic, configured to:
sequentially in time, for each combination of the M combinations:
configure the switches to form the first and second composite circuit elements according to the combination; and
measure a characteristic of the circuit that includes the formed first and second composite circuit elements, wherein the characteristic is indicative of how well the formed first and second composite circuit elements match;
choose a final combination of the M combinations whose measured characteristic indicates a best match; and
configure the switches to form the first and second composite circuit elements according to the final combination; and D circuit elements in addition to the N circuit elements, wherein the D circuit elements are designed to match the N circuit elements;

wherein the switches are configurable after fabrication, according to M+E different combinations, to connect N/2 of the N+D circuit elements to form a first composite circuit element of the pair and to connect a remaining N/2 of the N+D circuit elements to form a second composite circuit element of the pair, wherein E is a positive integer;

wherein the control logic configures the switches and measures the characteristic of the circuit for each combination of the M+E combinations; and wherein the control logic chooses the final combination as a combination of the M+E combinations whose measured characteristic indicates a best match.

* * * * *